United States Patent
Yang et al.

(10) Patent No.: US 6,645,884 B1
(45) Date of Patent: Nov. 11, 2003

(54) METHOD OF FORMING A SILICON NITRIDE LAYER ON A SUBSTRATE

(75) Inventors: Michael X. Yang, Fremont; Chien-Teh Kao, Sunnyvale; Karl Littau, Palo Alto; Steven A. Chen, Fremont; Henry Ho, San Jose; Ying Yu, Cupertino, all of CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/350,810

(22) Filed: Jul. 9, 1999

(51) Int. Cl.$^7$ ................................. H01L 21/02
(52) U.S. Cl. ................. 438/791; 438/584; 438/680; 438/758; 438/774; 438/775
(58) Field of Search ................. 438/584, 680, 438/758, 775, 774, 791

(56) References Cited

U.S. PATENT DOCUMENTS

| | | | |
|---|---|---|---|
| 5,399,387 A | | 3/1995 | Law et al. |
| 5,589,233 A | * | 12/1996 | Law et al. ............... 427/579 |
| 5,629,043 A | | 5/1997 | Inaba et al. |
| 5,663,087 A | * | 9/1997 | Yokozawa ............... 438/762 |
| 5,670,431 A | * | 9/1997 | Huanga et al. ............ 437/241 |
| 5,895,530 A | | 4/1999 | Shrotriya et al. |
| 5,932,286 A | | 8/1999 | Beinglass et al. |

OTHER PUBLICATIONS

Kyoung–Soo, Yi, et al., "The Effects of Deposition Variables on the Electrical Properties of Silicon Nitride Films by Chemical Vapor Deposition", Journal of Vacuum Science and Technology, vol. 4, No. 6, Nov. 1986, pp. 3082–3084.

"Method of Analyzing the Carbon Contamination of Thin Insulating Layers", IBM Technical Disclosure Bulletin, US, IBM Corp., New York, vol. 31, No. 9, Feb. 1989; p. 415.

Yeh, W.C., et al., "Low–Temperature–Chemical–Vapor–Deposition to Silicon–Nitride Film from Hexachloro–Disilane and Hydrazine", International Conference on Solid State Devices and Materials, Society of Applied Physics, Tokyo, Japan, Aug. 1995, pp. 488–490.

Vuillod, J., "Preparation and Characterization of Plasma Enhanced Chemical Vapor Deposited SiliconNitride and Oxynitride Films", Journal of Vacuum Science and Technology: Part A, American Institute of Physics, New York, vol. 5, No. 4, part 3, Jul. 1987, pp. 1675–1679.

International Search Report, PCT/US00/40339, Dec. 21, 2000.

* cited by examiner

Primary Examiner—Kamand Cuneo
Assistant Examiner—Lisa Kilday
(74) Attorney, Agent, or Firm—Blakely Sokoloff Taylor & Zafman

(57) ABSTRACT

The invention provides methods and apparatuses of forming a silicon nitride layer on a semiconductor wafer. A semiconductor wafer is located on a susceptor within a semiconductor processing chamber. A carrier gas, a nitrogen source gas, and a silicon source gas are introduced into the semiconductor processing chamber and a semiconductor wafer is exposed to the mixture of gases at a pressure in the chamber in the range of approximately 100 to 500 Torr.

26 Claims, 18 Drawing Sheets

99.72 Å / 1.594%

1004.6 Å / 1.335%

METHOD OF FORMING A SILICON NITRIDE LAYER ON A SUBSTRATE

BACKGROUND OF THE INVENTION

1. Field of the Invention

This invention relates generally to deposition technologies in integrated circuit chip processing and more particularly to the deposition of silicon nitride films.

2. Discussion of Related Art

The manufacture of semiconductor integrated circuits generally involves the formation of a plurality of layers of material on a semiconductor (e.g., silicon) wafer, each layer serving specific functions generally related to the routing and isolating of specific signals. One or more of these layers may comprise silicon nitride ($Si_3N_4$) as an insulator or mask. A conventional method of forming a silicon nitride layer on a wafer involves locating the wafer on a susceptor within a processing chamber and introducing a mixture of gases such as a silicon source gas, a nitrogen source gas, and a carrier gas into the processing chamber. The gases combine in the processing chamber at generally a pressure of about 300 millitorr (mTorr) to form the silicon nitride layer or film.

The processing chamber is heated by a heat source such as external heat lamps that direct light through transparent walls of the semiconductor processing a chamber to heat the chamber. A temperature measurement device such as a thermocouple, pyrometer, or a thermal camera may be used for detecting a temperature at a location on the susceptor.

The deposition rate, thickness, and uniformity of the silicon nitride layer may depend on a variety of parameters such as the pressure or the temperature in the chamber, or the amount and type of gas and flow rate of the gas across the wafer introduced into a chamber. Additionally, increasing one parameter such as temperature may affect another parameter such as pressure. For example, using a higher temperature generally allows for a lower pressure (e.g., 300 mTorr) to be used. Although higher temperatures result in a higher deposition rate of the silicon nitride layer on a wafer, high temperature deposition has its disadvantages. One disadvantage is that high temperature processing causes outdiffusion of dopants from, for example, P-type conductivity or N-type conductivity regions (P- or N-doped regions) of a semiconductor wafer. Outdiffusion may result in the breakdown of the electrical elements (e.g., transistors, capacitor, diodes, etc.) that are formed from doped regions. Avoidance of such outdiffusion is particularly important as device dimensions decrease below 0.25 $\mu$m.

It is desirable to provide a method of increasing the deposition of a silicon nitride layer on a wafer while avoiding the negative consequences seen in the prior art.

SUMMARY OF THE INVENTION

Methods and apparatuses of forming a silicon nitride layer on a semiconductor wafer are disclosed. In one embodiment of the invention, a mixture of gases that include a carrier gas, a nitrogen source gas, and a silicon source gas are introduced into the processing chamber at a pressure of approximately in the range of 100 to 500 Torr to form a $Si_3N_4$ film on a wafer in the processing chamber. In another embodiment of the invention a silicon nitride film is formed using an annular-shaped pumping plate that has a sidewall with a plurality of gas holes that communicate with a pumping channel to introduce the reactants into the chamber. Other aspects and methods of the invention as well as apparatuses formed using these methods are described further below in conjunction with the following figures.

BRIEF DESCRIPTION OF THE DRAWINGS

The invention is further described by way of example with reference to the accompanying drawings wherein.

DESCRIPTION OF PREFERRED EMBODIMENT

In the following description, for purposes of explanation, numerous specific details are set forth in order to provide a thorough understanding of the present invention. It will be evident, however, to one skilled in the art that the present invention may be practiced without these specific details. In certain instances specific apparatus, structures, and methods have not been described so as not to obscure the present invention.

The invention relates to methods and apparatuses of forming a silicon nitride film layer on a substrate such as a semiconductor wafer. In one embodiment, the film or layer is formed on a semiconductor wafer that is located on a susceptor within a single wafer processing chamber that is heated by using radiant or resistive heat. A mixture of gases, including a nitrogen source gas, a silicon source gas, and a carrier gas, are introduced into the chamber to form the $Si_3N_4$ film or layer. The wafer is exposed to the mixture at a wafer temperature of between 600° C. and 800° C. To form a suitable $Si_3N_4$ film or layer, the pressure in the processing chamber is maintained approximately in the range of 100–500 Torr. In an embodiment of the invention, a silicon nitride layer is formed using a pumping plate wherein the pumping plate has a first stepped portion, a second stepped portion, and a third stepped portion. A silicon source gas and a nitrogen source gas are introduced into the chamber to form the $Si_3N_4$ layer or film. In one embodiment, the partial pressure of the silicon source gas such as silane is approximately in the range of 0.05 to 5 Torr and the nitrogen source gas such as ammonia has a partial pressure equal to or less than 300 Torr in chamber. Other partial pressures may be used for the silicon and nitrogen source gases which depend, in part, upon the particular gas used.

The invention contemplates processing conditions that offer an improved deposition rate and uniformity of the $Si_3N_4$ layer. By increasing the reaction pressure beyond prior art teachings, the process of the invention may be operated at a lower temperature without deleteriously affecting the $Si_3N_4$ deposition or the wafer. $Si_3N_4$ layers may be used to form spacers, an etch stop, a hard mask, or dielectric elements.

Although the claimed invention is described relative to a resistively-heated processing chamber (FIGS. 1 through 3) and a radiantly-heated processing chamber (FIGS. 10 through 11), it is to be appreciated that other types of processing chambers may be used in conjunction with the techniques described herein.

Figure 1:
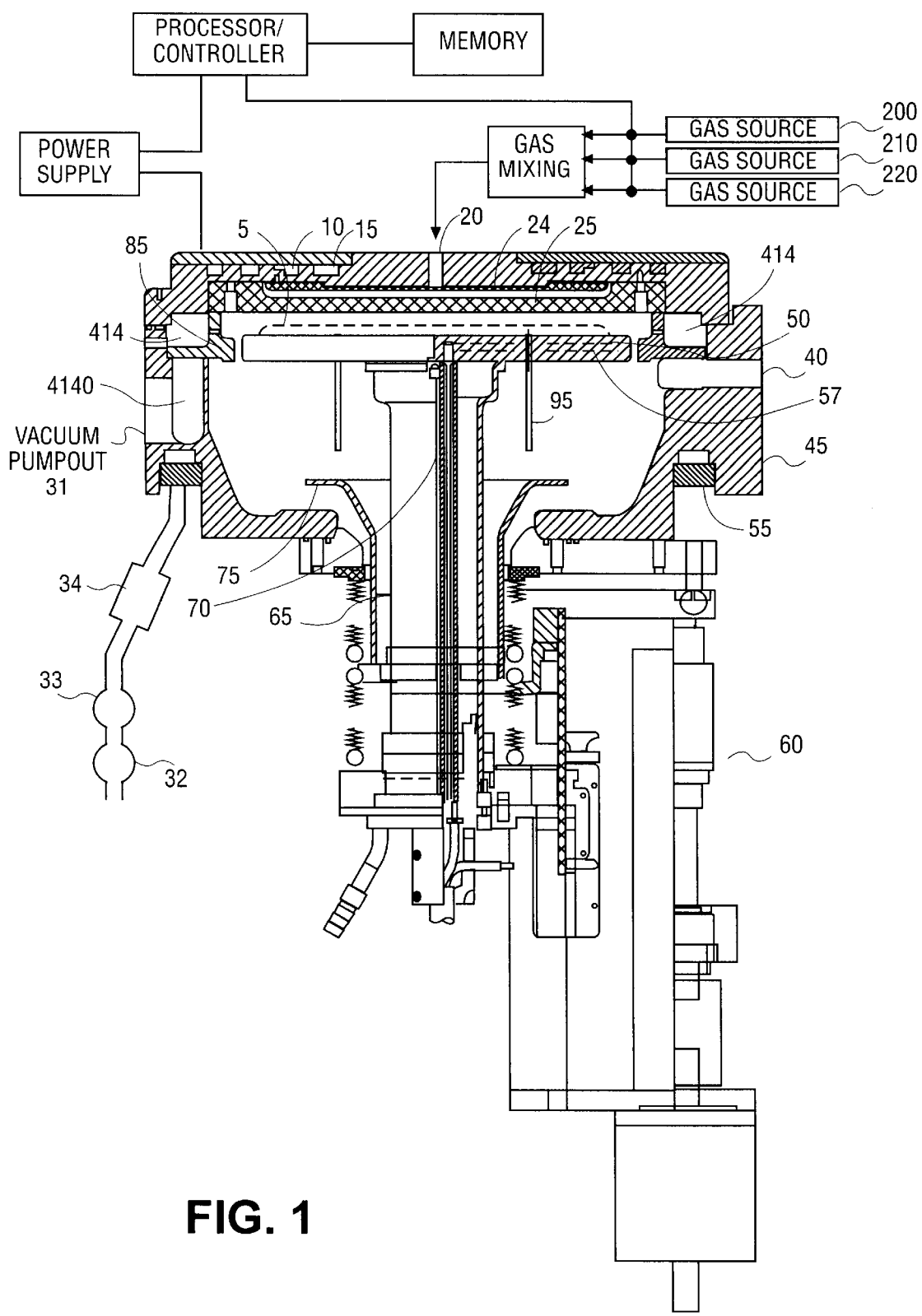
FIG. 1 shows cross-sectional side views of a processing chamber comprising a resistive heater in a "wafer process" position in accordance with an embodiment of the invention through a first cross-section and a section cross-section each through one-half of the chamber.
Figure 2:
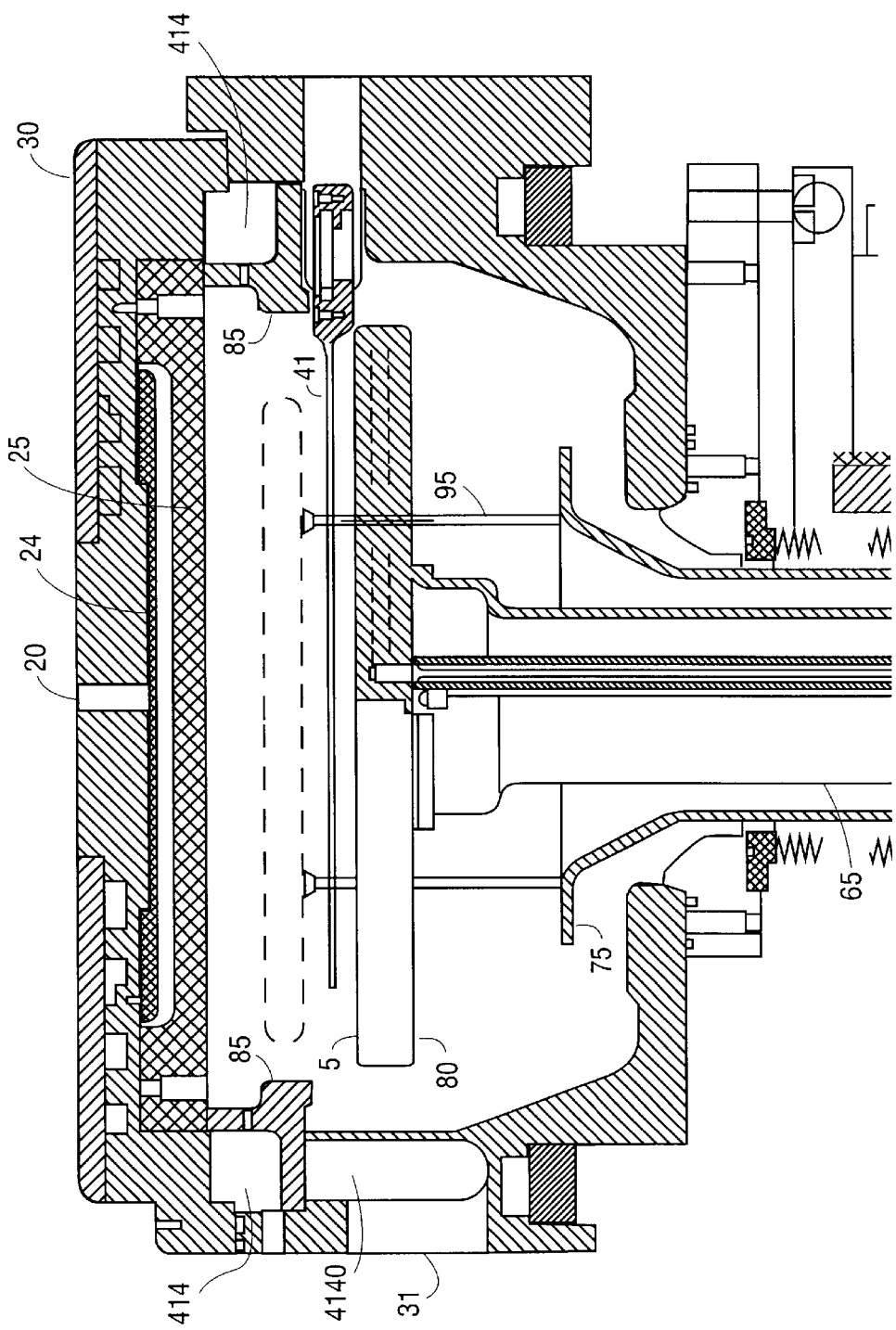
FIG. 2 shows similar cross-sectional side views as in FIG. 1 in a wafer-separate position.
Figure 3:
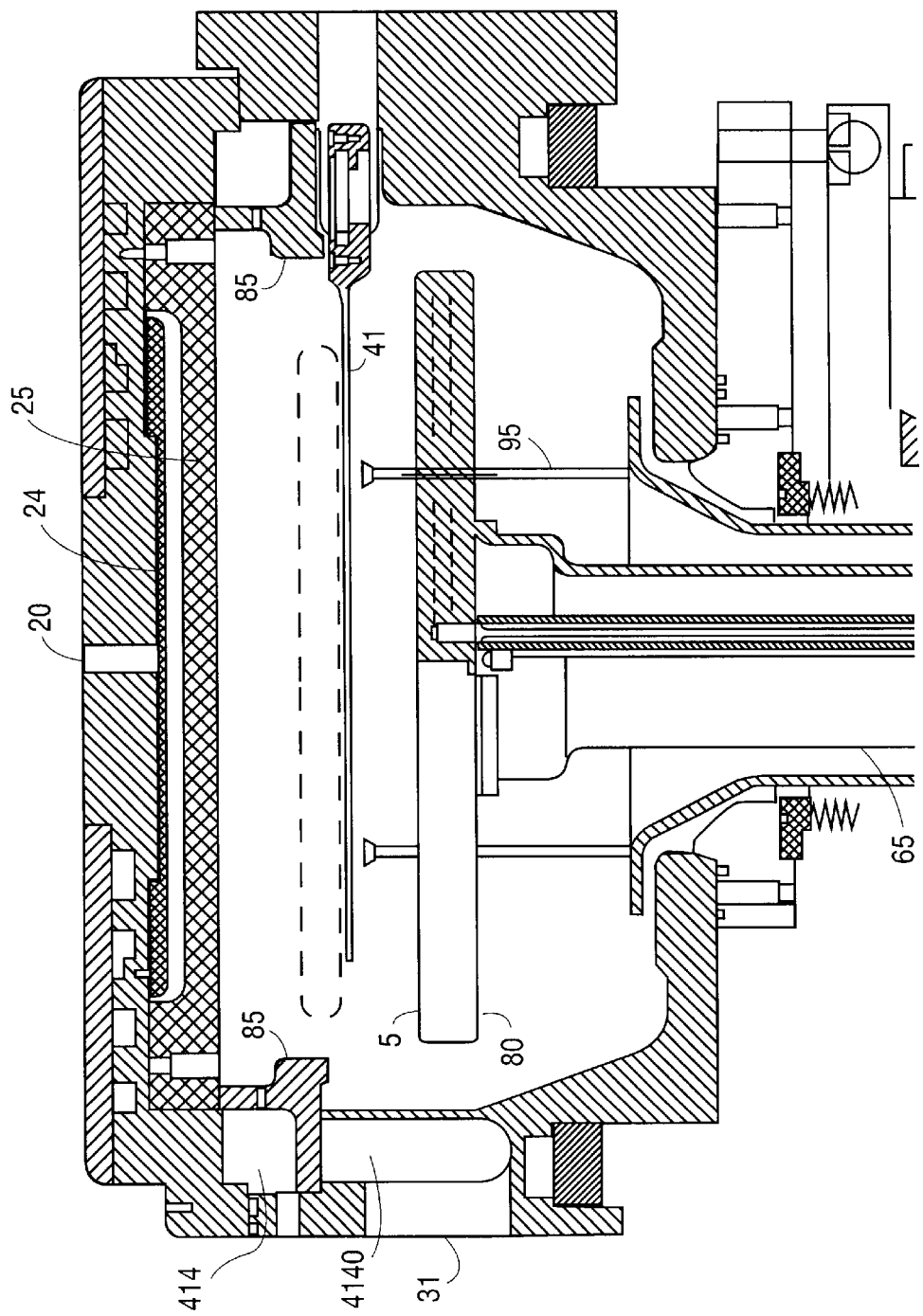
FIG. 3 shows similar cross-sectional side views as in FIG. 1 in a wafer-load position.

Referring to the drawings, a low pressure chemical vapor deposition (LPCVD) chamber is described. FIGS. 1–3 show cross-sectional views of one type of reactor such as a resistive reactor used to practice the invention. FIGS. 1–3 each show cross-sectional views of a chamber through two different cross-sections, each cross-section representing a view through approximately one-half of the chamber.

The LPCVD chamber illustrated in FIGS. 1–3 is constructed of materials such that, in this embodiment, a pressure of greater than or equal to 100 Torr can be maintained. For the purpose of illustration, a chamber of approximately in the range of eight liters is described. FIG. 1 illustrates the inside of process chamber body 45 in a "wafer-process" position. FIG. 2 shows the same view of the chamber in a "wafer-separate" position. FIG. 3 shows the same cross-sectional side view of the chamber in a "wafer-load" position. In each case, a wafer is indicated in dashed lines to indicate its location in the chamber.

FIGS. 1–3 show chamber body 45 that defines reaction chamber 90 in which the reaction between a process gas or gases and the wafer takes place (e.g., a CVD reaction). Chamber body 45 is constructed, in one embodiment, of aluminum and has passages 55 for water to be pumped therethrough to cool chamber body 45 (e.g., a "cold-wall" reaction chamber). Resident in chamber 90 is resistive heater 80 including, in this view, susceptor 5 supported by shaft 65. Susceptor 5 has a surface area sufficient to support a substrate such as a semiconductor wafer (shown in dashed lines).

Process gas enters otherwise sealed chamber 90 through gas distribution port 20 in a top surface of chamber lid 30 of chamber body 45. The process gas then goes through blocker plate 24 to distribute the gas about an area consistent with the surface area of a wafer. Thereafter, the process gas is distributed through perforated face plate 25 located, in this view, above resistive heater 80 and coupled to chamber lid 30 inside chamber 90. One objective of the combination of blocker plate 24 with face plate 25 in this embodiment is to create a uniform distribution of process gas at the substrate, e.g., wafer.

A substrate such as a wafer is placed in chamber 90 on susceptor 5 of heater 80 through entry port 40 in a side portion of chamber body 45. To accommodate a wafer for processing, heater 80 is lowered so that the surface of susceptor 5 is below entry port 40 as shown in FIG. 3. Typically by a robotic transfer mechanism, a wafer is loaded by way of, for example, a transfer blade into chamber 90 onto the superior surface of susceptor 5. Once loaded, entry port 40 is sealed and heater 80 is advances in a superior (e.g., upward) direction toward face plate 25 by lifter assembly 60 that is, for example, a step motor. The advancement stops when the wafer is a short distance (e.g., 400–700 mils) from face plate 25 (see FIG. 1). In the wafer-process position, chamber 90 is effectively divided into two zones, a first zone above the superior surface of susceptor 5 and a second zone below the inferior surface of susceptor 5. It is generally desirable to confine the film formation to the first zone.

At this point, process gas controlled by a gas panel flows into chamber 90 through gas distribution port 20, through blocker plate 24 and perforated face plate 25. Process gas typically reacts or contacts a wafer to form a film on the wafer. At the same time, an inert bottom-purge gas, e.g., nitrogen, is introduced into the second chamber zone to inhibit film formation in that zone. In a pressure controlled system, the pressure in chamber 90 is established and maintained by a pressure regulator or regulators coupled to chamber 90. In one embodiment, for example, the pressure is established and maintained by baretone pressure regulator (s) coupled to chamber body 45 as known in the art. In this embodiment, the baretone pressure regulator(s) maintains pressure at a level of equal to or greater than 100 Torr. A suitable mid-level pressure range is approximately 100–300 Torr.

Residual process gas is pumped from chamber 90 through pumping plate 85 to a collection vessel at a side of chamber body 45 (vacuum pumpout 31). Pumping plate 85 creates two flow regions resulting in a gas flow pattern that creates a uniform $Si_3N_4$ layer on a substrate.

Pump 32 disposed exterior to apparatus 2 provides vacuum pressure within pumping channel 4140 (below channel 414 in FIGS. 1–3) to draw both the process and purge gases out of the chamber 90 through vacuum pumpout 31. The gas is discharged from chamber 90 along a discharge conduit 33. The flow rate of the discharged gas through channel 4140 is preferably controlled by a throttle valve 34 disposed along conduit 33. The pressure within processing chamber 90 is monitored with sensors (not shown) and controlled by varying the cross-sectional area of conduit 33 with throttle valve 34. Preferably, a controller or processor receives signals from the sensors that indicate the chamber pressure and adjusts throttle valve 34 accordingly to maintain the desired pressure within chamber 90. A suitable throttle valve for use with the present invention is described in U.S. Pat. No. 5,000,225 issued to Murdoch and assigned to Applied Materials, Inc., the complete disclosure of which is incorporated herein by reference.

Once wafer processing is complete, chamber 90 may be purged, for example, with an inert gas, such as nitrogen. After processing and purging, heater 80 is advanced in an inferior direction (e.g., lowered) by lifter assembly 60 to the position shown in FIG. 2. As heater 80 is moved, lift pins 95, having an end extending through openings or throughbores in a surface of susceptor 5 and a second end extending in a cantilevered fashion from an inferior (e.g., lower) surface of susceptor 5, contact lift plate 75 positioned at the base of chamber 90. As is illustrated in FIG. 2, in one embodiment, at this point, lift plate 75 remains at a wafer-process position (i.e., the same position the plate was in FIG. 1). As heater 80 continues to move in an inferior direction through the action of lifter assembly 60, lift pins 95 remain stationary and ultimately extend above the superior or top surface of susceptor 5 to separate a processed wafer from the surface of susceptor 5. The surface of susceptor 5 is moved to a position below opening 40.

Once a processed wafer is separated from the surface of susceptor 5, transfer blade 41 of a robotic mechanism is inserted through opening 40 beneath the heads of lift pins 95 and a wafer supported by the lift pins. Next, lifter assembly 60 inferiorly moves (e.g., lowers) heater 80 and lift plate 75 to a "wafer load" position. By moving lift plate 75 in an inferior direction, lift pins 95 are also moved in an inferior direction, until the surface of the processed wafer contacts the transfer blade. The processed wafer is then removed through entry port 40 by, for example, a robotic transfer mechanism that removes the wafer and transfers the wafer to the next processing step. A second wafer may then be loaded into chamber 90. The steps described above are generally reversed to bring the wafer into a process position. A detailed description of one suitable lifter assembly 60 is described in U.S. Pat. No. 5,772,773, assigned to Applied Materials, Inc., of Santa Clara, Calif.

In a high temperature operation, such as LPCVD processing to form a $Si_3N_4$ film, the reaction temperature inside chamber 90 can be as high as 750° C. or more. Accordingly, the exposed components in chamber 90 must be compatible with such high temperature processing. Such materials should also be compatible with the process gases and other chemicals, such as cleaning chemicals (e.g., $NF_3$) that may be introduced into chamber 90. Exposed surfaces of heater 80 may be comprised of a variety of materials provided that the materials are compatible with the process. For example, susceptor 5 and shaft 65 of heater 80 may be comprised of similar aluminum nitride material. Alternatively, the surface of susceptor 5 may be comprised of high thermally conductive aluminum nitride material (on the order of 95% purity with a thermal conductivity from 140 W/mK to 200 W/mK) while shaft 65 is comprised of a lower thermally conductive aluminum nitride. Susceptor 5 of heater 80 is typically bonded to shaft 65 through diffusion bonding or brazing as such coupling will similarly withstand the environment of chamber 90.

FIG. 1 also shows a cross-section of a portion of heater 80, including a cross-section of the body of susceptor 5 and a cross-section of shaft 65. In this illustration, FIG. 1 shows the body of susceptor 5 having two heating elements formed therein, first heating element 50 and second heating element 57. Each heating element (e.g., heating element 50 and heating element 57) is made of a material with thermal expansion properties similar to the material of the susceptor. A suitable material includes molybdenum (Mo). Each heating element includes a thin layer of molybdenum material in a coiled configuration.

In FIG. 1, second heating element 57 is formed in a plane of the body of susceptor 5 that is located inferior (relative to the surface of susceptor in the figure) to first heating element 50. First heating element 50 and second heating element 57 are separately coupled to power terminals. The power terminals extend in an inferior direction as conductive leads through a longitudinally extending opening through shaft 65 to a power source that supplies the requisite energy to heat the surface of susceptor 5. Extending through openings in chamber lid are two pyrometers, first pyrometer 10 and second pyrometer 15. Each pyrometer provides data about the temperature at the surface of susceptor 5 (or at the surface of a wafer on susceptor 5). Also of note in the cross-section of heater 80 as shown in FIG. 1 is the presence of thermocouple 70. Thermocouple 70 extends through the longitudinally extending opening through shaft 65 to a point just below the superior or top surface of susceptor 5.

In accordance with one embodiment of the invention to form a $Si_3N_4$ film on a wafer, the gases include a carrier gas 200, a nitrogen source gas 220, and a silicon source gas 210. Suitable carrier gas sources include, but are not limited to, hydrogen ($H_2$), nitrogen ($N_2$), argon (Ar), and helium (He). Suitable nitrogen source gas includes, but is not limited to, ammonia ($NH_3$). Suitable silicon source gas includes, but is not limited to, silane, dichlorosilane, and disilene. The nitrogen source gas and the silicon source gas combine to produce a $Si_3N_4$ layer on the wafer.

In use, silicon source gas 210 may be mixed with carrier gas 200 before or during introduction into the processing chamber 90. The mixture of the carrier gas and the silicon source gas is then introduced into gas inlet 20 of chamber 90. Nitrogen source gas 220 is also introduced into gas inlet 20 and allowed to mix with the mixture of the carrier gas and the silicon source gas. The process gas passes through the plurality of holes in a blocker plate 24 and then through the plurality of holes in the face plate 25. These gases then flow into chamber 90 wherein the gases are exposed to a wafer. Thereafter, the process gas exits through the pumping plate 85 into the pumping channel 414.

The flow rate of the gases is dependent upon the size of semiconductor processing chamber 90. In one embodiment, the total flow rate of the gases ranges from five to fifteen liters per minute based upon a total effective volume of a processing chamber of one to nine liters. The ratio of at least one of the gases or the total gas flow rate relative to the chamber is 0.50 to 8 liters per minute per liter of chamber volume.

Exposure of the wafer to the mixture of gases causes deposition of a silicon nitride ($Si_3N_4$) layer on the wafer according to thermal chemical vapor deposition principles. Exposure of the gases in the wafer at an elevated temperature causes dissociation of the molecules of the silicon source gas and the nitrogen source gas into smaller molecules. The smaller molecules then recombine with one another. Provided below is a general chemical reaction that occurs in this process. Silane generally reacts with ammonia according to the chemical equation $$3SiH_4 + 4NH_3 \rightarrow Si_3N_4 + 12H_2$$

As a general rule, the higher the temperature in chamber 90, and therefore of wafer and susceptor, the quicker the silicon nitride layer will form.

In one embodiment, $SiH_4$, $NH_3$, and $N_2$ are introduced with 100 standard cubic centimeters per minute (sccm) of $SiH_4$, 5 standard liters per minute (slm) of $NH_3$, and 10 slm of $N_2$, while wafer is heated to a temperature of between 600° C. and 800° C. During deposition, pressure in the chamber of between 100 to 500 Torr is maintained. A suitable mid-level pressure range is greater than 100 Torr to 350 Torr. In one embodiment, the partial pressure of silane is approximately in the range of 0.05 to 5 Torr and ammonia has a partial pressure equal to or less than 300 Torr in chamber. However, other partial pressures may be used for the silicon and nitrogen source gases which may depend upon the particular gas used.

In another embodiment, gases may be used in the following proportions: $SiH_4$: 70 sccm, $NH_3$: 2 slm, and $N_2$: 8 slm. In yet another embodiment, gases may be used in the following proportions: dichlorosilane ($SiH_2Cl_2$): 230 sccm, $NH_3$: 1,000 sccm, and $H_2$: 9,000 sccm. If $N_2$ is used as a carrier gas, a deposition rate of about 50 to 5,000 Å per minute may be achieved at a temperature as low as 600° C.

The above embodiment described controlling conditions in a reaction chamber to form a $Si_3N_4$ film on a wafer. It is to be appreciated that such control may be done manually or with the aid of a system controller. In the former instance, an operator may monitor and adjust the power supply to the heater to control the temperature, and a vacuum source to control the pressures. The operator may also manually adjust valves associated with the individual gases to regulate the mixture and flow rate of the gases.

A system controller may also be employed to handle the control tasks associated with system control. FIG. 1 illustrates a system controller or processor coupled to a power supply and a gas manifold. The controller may be configured to record the temperature measured by the temperature indicators and control the power supplied to the heating elements based, for example, on an algorithm that determines a relative value of the temperature difference and adjusts the heating elements accordingly. The controller may also be configured to control the mixture and flow of gases to the processing chamber. In an LPCVD reaction process, the controller may further be coupled to a pressure indicator that measures the pressure in the chamber as well as a vacuum source to adjust the pressure in the chamber.

The system controller is supplied with control signal generation logic. The controller may also be coupled to a user interface that allows an operator to enter the reaction parameters, such as the desired reaction temperature, the acceptable tolerance of a temperature difference between indicators (e.g., ±3° C.), the reaction pressure, and the flow of gases to the processing chamber.

Control signal generation logic is supplied to the system controller in the form of, for example, software instruction logic that is a computer program stored in a computer-readable medium such as the memory of the controller. The computer program includes sets of instructions that dictate the timing, mixture of gases, chamber pressure, chamber temperature, and other parameters of a particular process. It is to be appreciated that other computer programs such as one stored on another memory device, including but not limited to, a floppy disk, may also be used to operate the system, controller.

The computer program code can be written in a computer-readable programming language such as, for example, 68000 assembly language, C, C++, Pascal, Fortran or others. Suitable program code is generally entered into a single file or multiple files using a text editor. If the entered code text is in a high level language, the code is compiled, and the resultant compiler code is then linked with an object code or precompiled object code, the system invokes the object ode, causing the computer system to load the code in memory, from which the central processing unit reads and executes the code to perform the task identified in the program.

In one aspect of the invention, an apparatus and method of improving the uniformity of process/reactant gas distribution is described. As described above, process gas such as a silicon source gas and a nitrogen source gas (along with a carrier gas) is introduced into chamber 90 through gas distribution port 20. The process gas flows through blocker plate 24 and face plate 25 which create a shower-head like cascade of the process gas over a surface of a wafer on the surface of susceptor 5. As gas is introduced into chamber 90 gas is also removed so that a pre-determined pressure may be maintained during processing. In the configuration of the chamber shown in FIGS. 1–3, gas is removed from a side of the chamber, e.g., pumped out at one side designated vacuum pump-out 31. In prior art systems, the asymmetrical removal of gases from one side of the chamber created pressure differences in the chamber; for example, a pressure measured at a point in the chamber nearer a chamber pump-out was different (e.g., less) than a pressure measured at a point distant from the pump-out. The pressure difference contributed to non-uniformity of deposition of a film on a wafer.

In one embodiment of the invention, a pumping plate is provided to direct the flow of gases in the chamber. The pumping plate of the invention defines two gas flow regions: a first flow region of process gases directed at a wafer on the surface of susceptor 5 and a second flow region defined by a radial channel about the pumping plate of gases primarily to be discharged from the chamber. By creating the two regions, a more uniform pressure may be maintained in the chamber. The invention contemplates that a static pressure difference between the two flow regions can be established throughout the chamber contributing to more uniform deposition of films across a wafer.

Figure 4:
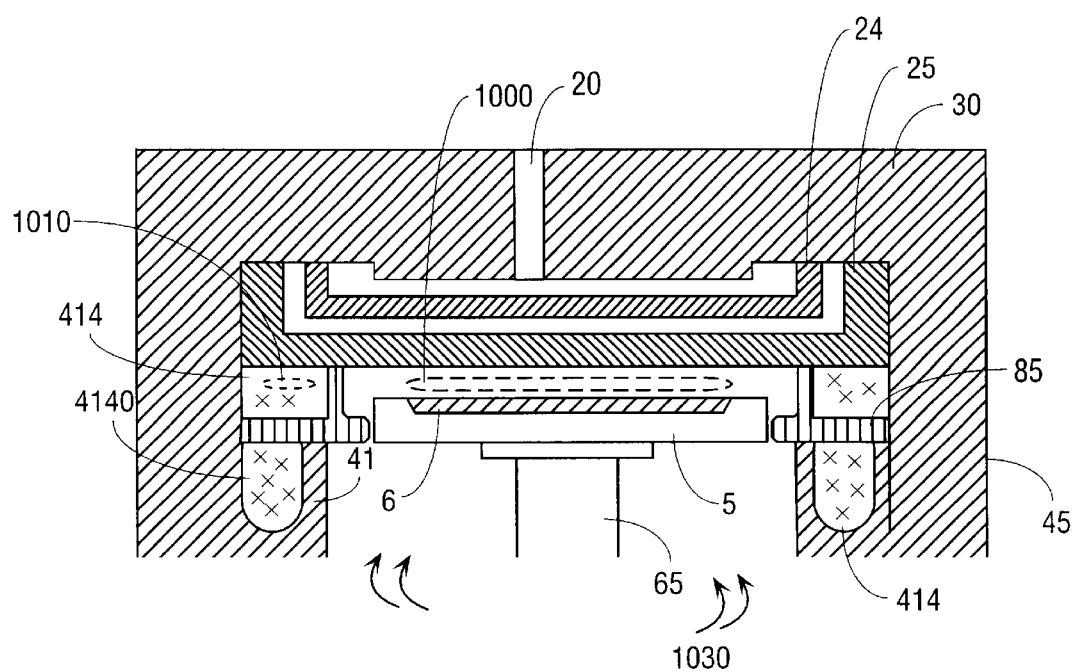
FIG. 4 shows another cross-sectional side view of a portion of a processing chamber position in accordance with an embodiment of the invention.

Referring to FIGS. 4 through 10, components of the invention utilized to coordinate a uniform flow of process gas in the chamber will now be described in detail relative to their use in the resistively-heated processing chamber described in FIGS. 1 through 3. FIG. 4 shows a schematic cross-sectional side view of a portion of a processing chamber. FIG. 4 illustrates a portion of a chamber in a position through a single cross-section to illustrate the two gas flow regions. The cross-section is through a center axis of the chamber to illustrate the location of susceptor 5 relative to pumping plate 85. In the wafer-process position, a portion of susceptor 5 sits within an annular opening of pumping plate 85 (a portion of pumping plate 85 surrounding susceptor 5 is cut-away in this cross-section).

As seen in the illustration in FIG. 4, pumping plate 85 rests on inner chamber portion 41 of chamber wall 45. An underside of pumping plate 85 and inner chamber portion 41 defines channel 4140 extending circumferentially around the chamber. Channel 4140 does not extend completely around the chamber as a portion of a similar chamber area is utilized by entry port 40 to load and remove a wafer. In one embodiment, channel 4140 extends approximately 270° around the chamber. Vacuum pump-out 31 is linked to channel 4140 to discharge gases from the chamber.

As shown in FIG. 4, pumping plate 85 includes (in this view) a vertical annular first stepped portion 464 that forms a circumferential edge of a longitudinal or vertical wall to face plate 25. Second stepped portion 466 comprises a lateral portion that protrudes from the circumferential edge. Together, first stepped portion 464 and second stepped portion 466 define channel 414 between face plate 25, chamber wall 40 and pumping plate 85. The vertical wall separates first flow region 1000 where process gas is directed at a wafer (to be seated in wafer pocket 6 of susceptor 5) from second region 1010 where gas is discharged from the chamber. Gas from first flow region 1000 enters second flow region 1010 through circumferentially located holes (gas holes 490) extending around first portion 464 of pumping plate 85. The flow of gas in second flow region 1010 is radial and second flow region 1010 communicates with channel 4140 to remove gas from the chamber.

Figure 5:
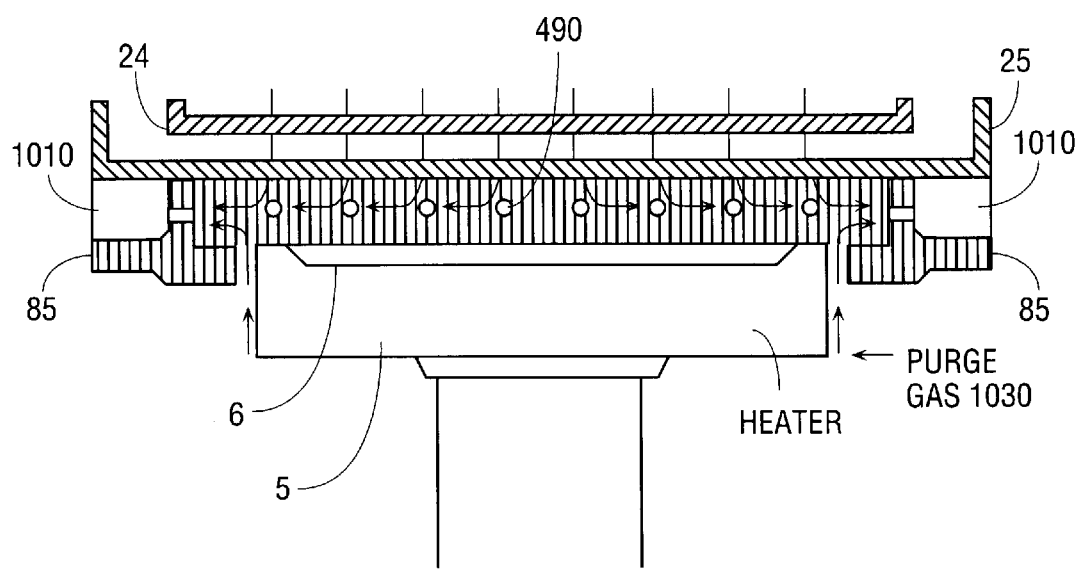
FIG. 5 shows yet another cross-sectional side view of a portion of a processing chamber position in accordance with an embodiment of the invention.
Figure 6:
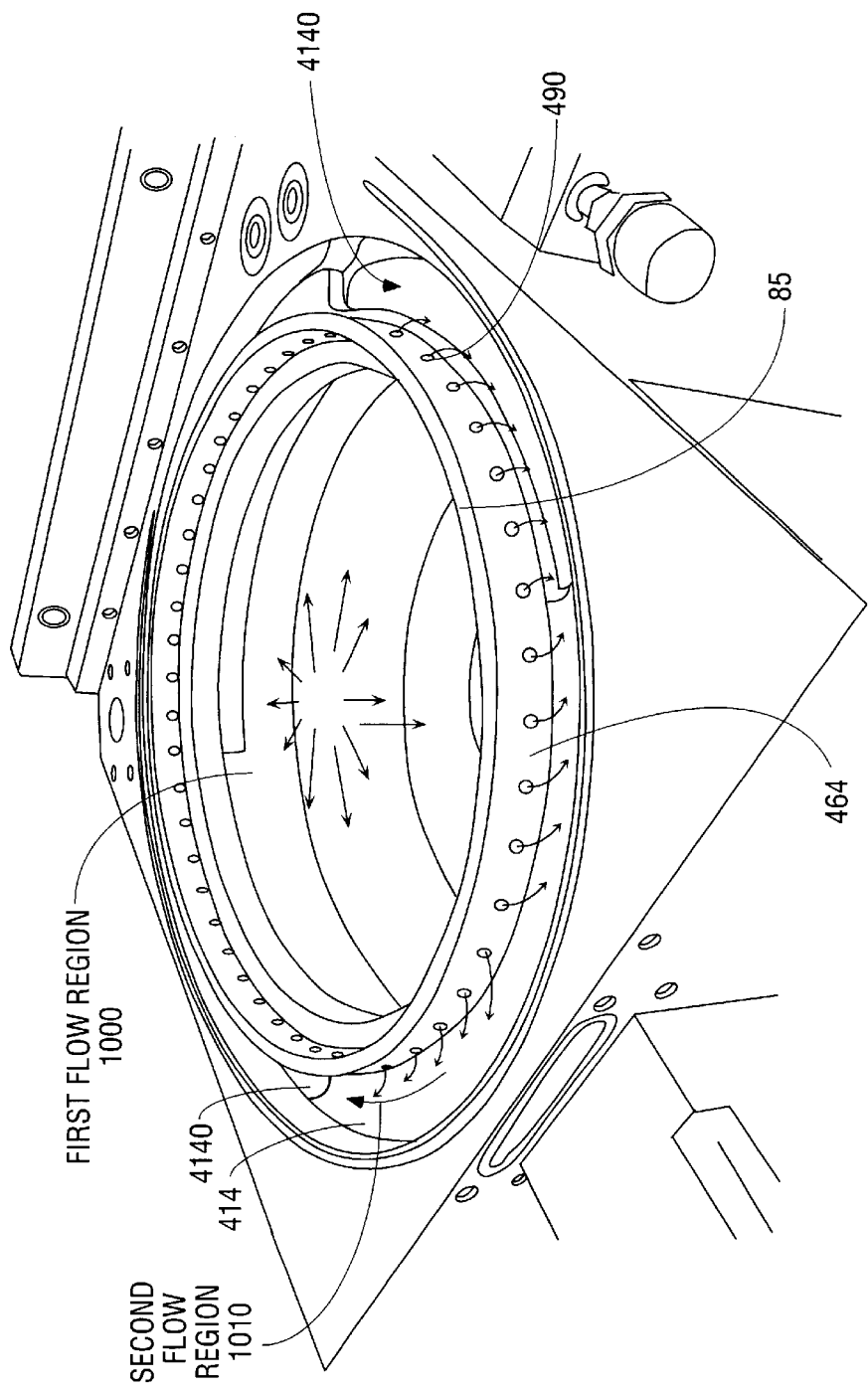
FIG. 6 shows a top perspective view of a portion of a processing chamber with the chamber lid removed in accordance with an embodiment of the invention.

FIGS. 5 and 6 show schematic views of the general flow direction of process gases through the chamber. FIG. 5 is a cross-section through the chamber that shows pumping plate 85 surrounding a portion of susceptor 5. In FIG. 5, process gas is illustrated entering through the gas inlet of the chamber and passing through blocking plate 24 and face plate 25. In first flow region 1000, process gas arrives at the surface of susceptor 5 to react with a wafer in pocket 6 of susceptor 5 and form a film of, for example, $Si_3N_4$ or other desired material (e.g., $SiO_2$, polysilicon, etc.). Residual process gas as well as bottom purge gas 1030 is directed to second flow region 1010 to be discharged from the chamber. Gas enters second flow region 1010 by gas holes 490 circumferentially spaced around pumping plate 85. In this embodiment, the gas holes 490 are positioned to be above the top surface of a wafer on susceptor 5 during processing. In general, gas holes 490 are positioned at least at the level of a wafer or above the wafer when the heater is in the "wafer process" position.

FIG. 6 further shows the process flow of gas entering and exiting pumping plate 85. FIG. 6 is a top perspective view without the resistive heater, the chamber lid, blocking plate, and face plate. FIG. 6 shows generally U-shaped pumping channel 414 that substantially surrounds a susceptor and defines second flow region 1010. Radially oriented gas holes 490 are positioned around the entire perimeter of the pumping plate and communicate with pumping channel 414. Gas holes 490 in the side wall of pumping plate 85 allow gas to flow horizontally into pumping channel 414. Pumping channel 414 communicates with channel 4140 through two large openings in channel 414: openings defined by the absence of sections of lateral second stepped portion 466 of pumping plate 85. Second stepped portion 466 is comprised of two flange portions (see FIG. 7). One flange portion isolates channel 414 from entry port 40 while a second flange portion separates channel 414 from a region of channel 4140 occupied by vacuum pump-out 31. Configuring the flange portions in this manner helps to maintain a uniform pressure in channel 414.

Gas holes 490 in first stepped portion 464 of pumping plate 85 are shown in FIG. 6 substantially evenly spaced apart from one another. Additionally, the gas holes are generally centered in first stepped portion 464 of pumping plate 85. The placement of gas holes 498 in the side wall of pumping plate 85 and the division of first flow region 1000 and second flow region 1010 creates a consistent pressure difference between first flow region 1000 and second flow region 1010. This feature allows the gas flow within the chamber to be more uniform than prior art configurations. In the prior art, a pumping plate had varying pressure differentials at various points along the pumping plate which resulted in non-uniform gas flow regions.

Figure 7:
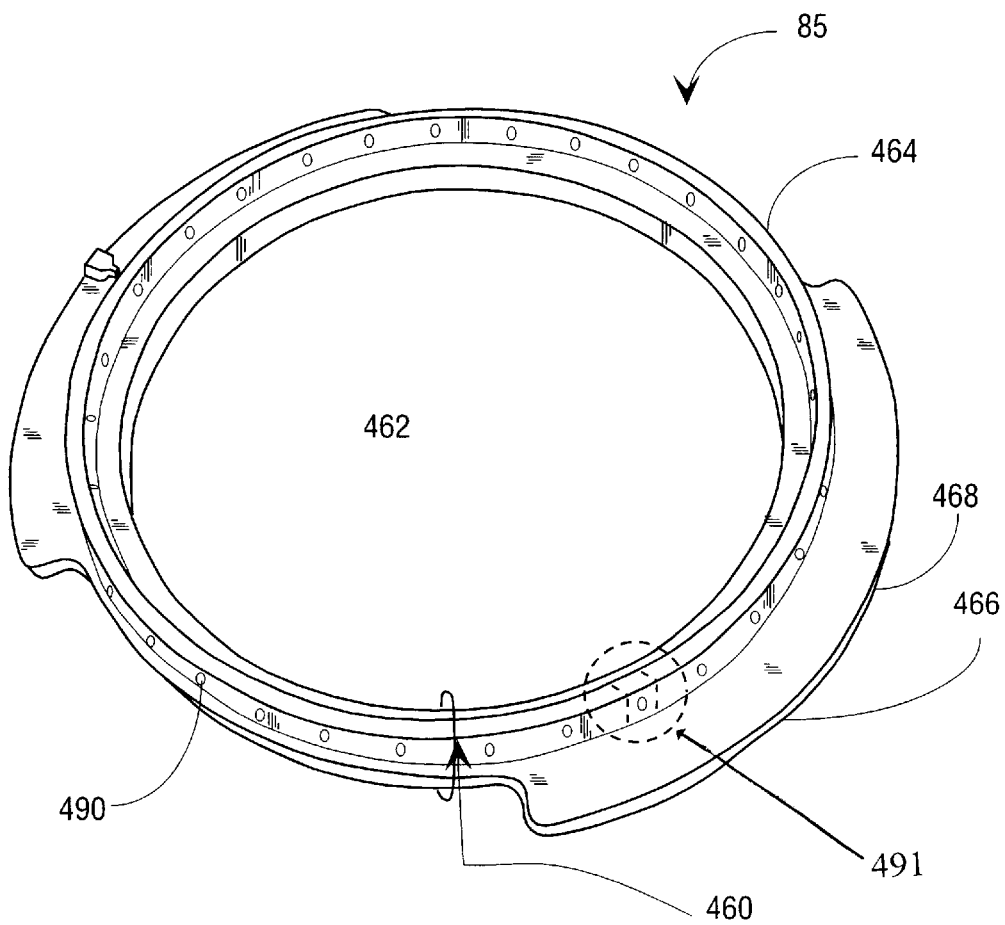
FIG. 7 shows a top perspective view of a pumping plate in accordance with an embodiment of the invention.
Figure 9:
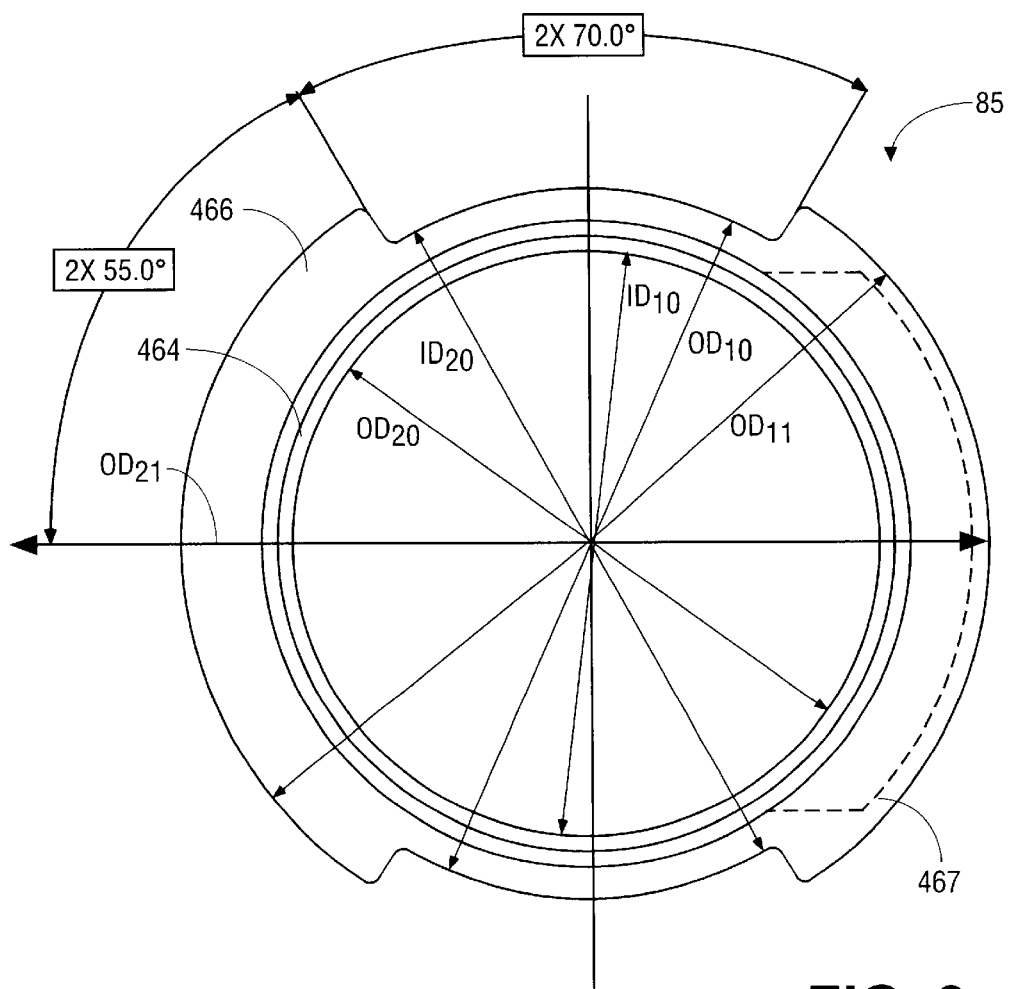
FIG. 9 shows a top plan view of a pumping plate in accordance with an embodiment of the invention.
Figure 10:
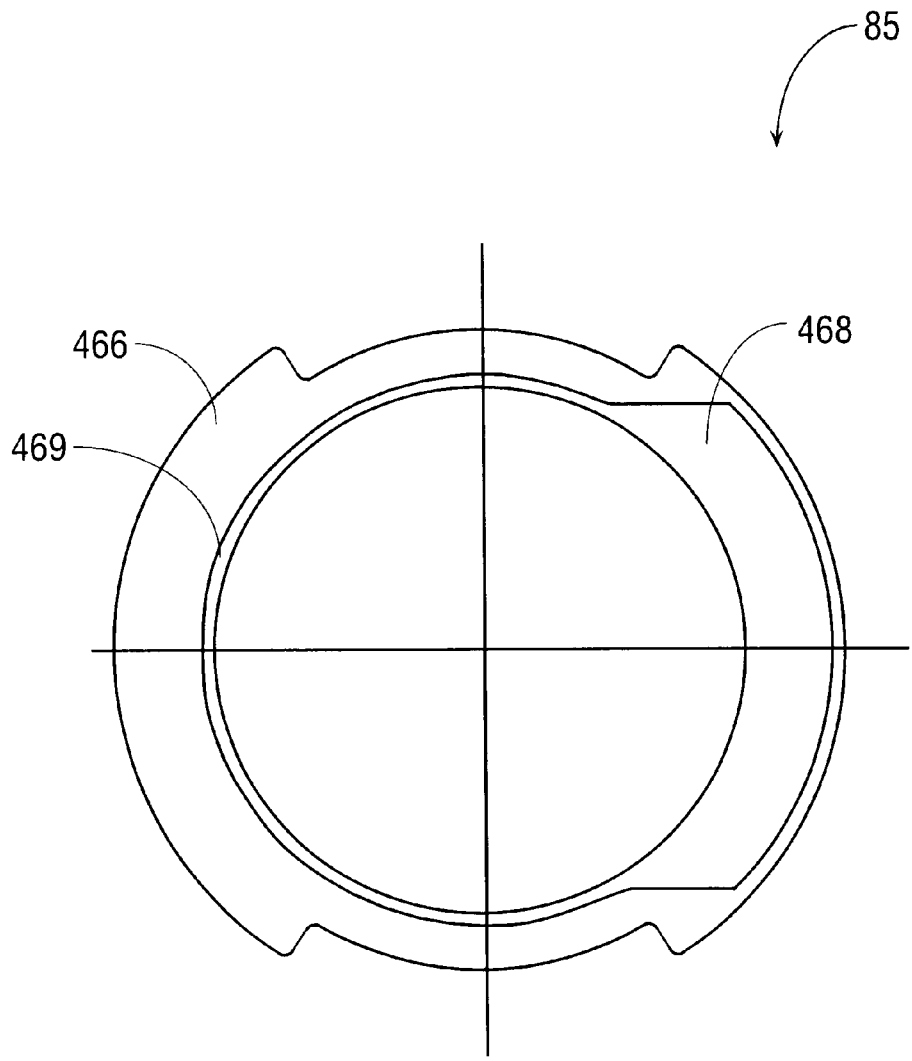
FIG. 10 shows a bottom plan view of a pumping plate in accordance with an embodiment of the invention.
Figure 11:
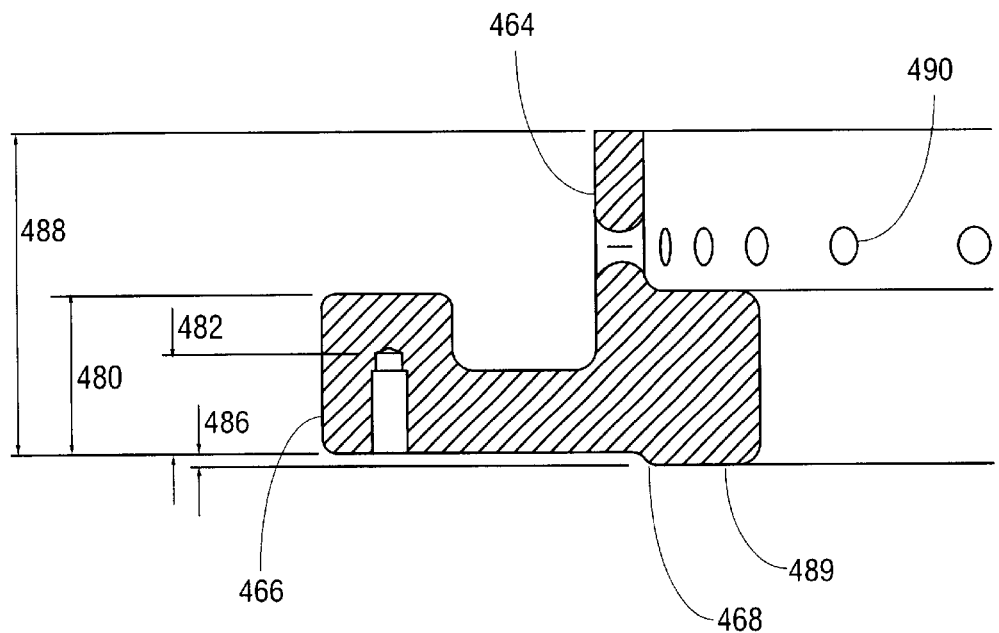
FIG. 11 shows a cross-sectional side view of portion of a pumping plate in accordance with an embodiment of the invention.
Figure 12:
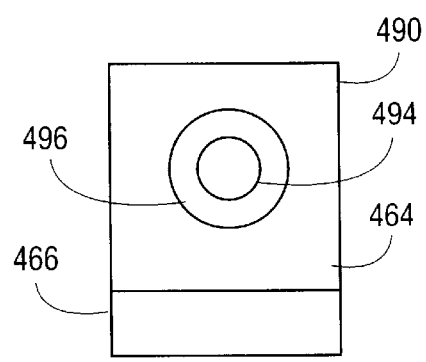
FIG. 12 shows side plan view of a portion of a pumping plate having a single gas hole plate in accordance with an embodiment of the invention.

FIGS. 7–12 illustrate different views of an embodiment, or a portion of an embodiment, of a pumping plate of the invention. FIG. 7 illustrates a perspective top view, FIG. 8 a planar side view, FIG. 9 a planar top view, and FIG. 10 a planar bottom view. FIGS. 11–12 show portions of the pumping plate to more clearly describe certain features.

Pumping plate 85 comprises generally annular member 460. In one embodiment, member 460 is an integral piece comprising a process compatible metal, such as aluminum alloy or preferably C275 aluminum alloy, that will be suitably shaped to fit within a particular semiconductor processing chamber. C275 aluminum alloy is commercially available from Alcoa Advanced Technologies of Engelwood, Colo. Although member 460 is preferably constructed of a single integral piece of metal with different portions of member 460, the pumping plate 85 may be comprised of pieces connected or coupled together.

In the specific configuration described herein, member 460 includes first stepped portion 464, second stepped portion 466, and third stepped portion 468. First stepped portion 464 forms a vertical side wall to define channel 414 and separate second flow region 1010 from first flow region 1000. Second stepped portion 466 defines the lateral portion or floor of pumping channel 414. Third stepped portion 468 serves to align pumping plate 85 in a predetermined position within a processing chamber.

Figure 8:
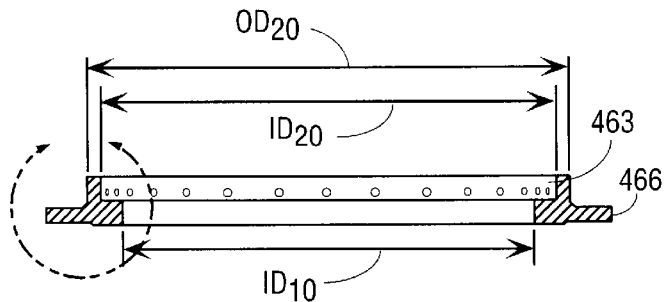
FIG. 8 shows a side plan view of a pumping plate in accordance with an embodiment of the invention.

In the eight liter processing chamber described with reference to FIGS. 1–3, the thickness of first stepped portion 468 ranges from approximately 0.06 inches to 0.10 inches ad is preferably 0.06 inches. With reference to FIGS. 8–9, inner diameter $ID_{10}$ of second stepped portion 466 is, for example, 9,572 inches, and the outer diameter $OD_{10}$ is, for example, 11.25 inches. Inner diameter $ID_{10}$ of second stepped portion 466 is slightly larger than the diameter of susceptor 5 so that susceptor 5 will fit within the opening in annular member 460 of pumping plate 85. In one embodiment, there is approximately 0.12 to 0.18 inches spacing between susceptor 5 and second stepped portion 466. $ID_{20}$ of first stepped portion 464 is 10.4 inches. $OD_{20}$ of first stepped portion 464 is 10.9 inches. As shown in FIG. 11, height 488 of pumping plate 85 in this embodiment is 1.20 inches. The distance between base 489 of the pumping plate (the base of third stepped portion 468) and the central point of gas hole 490 extending through the first stepped portion 464 is 0.728 inches.

Second stepped portion 466 comprises two flange portions which extend the outside diameter from $OD_{10}$ to $OD_{11}$. $OD_{11}$ ranges from a diameter of 12.93 inches. Each flange portion has an area in proportion to an arc defined between two radii of first and second portion of annular member 460, respectively. FIG. 9 shows each flange with a bi-section having an area in proportion to an arc of 55°.

The flange portions of second stepped portion 466 (i.e., the lateral portions) define the base of channel 414 and second flow region 1010. Between each flange portion are provided openings to channel 4140 and vacuum pump-out 31. In one embodiment, an area between flange portions is in proportion to an arc of 70°.

As illustrated by the bottom plan view of FIG. 10, third stepped portion creates a seat for pumping plate 85 to rest on inner chamber portion 41. In this embodiment, third stepped portion 468 includes a single lip portion coinciding with an area similar to an area of one of the flange portions of second stepped portion 466. The lip portion serves, in one aspect, to orient pumping plate 85 in the chamber.

The diameters of the first, second, and third stepped portions of the pumping plate will depend on the characteristics of the individual deposition apparatus, such as the diameter of the perforated face plate 25, the radial distance between pumping channel 414 and chamber 90, the height of susceptor 5 (i.e., the axial distance between channel 414 and chamber 90), and the diameter of the susceptor 5.

Pumping plate 85 comprises a plurality of gas holes 490 through the side wall of first stepped portion 464 that communicate first flow region 1000 with channel 414 and second flow region 1010. In one embodiment, forty-eight gas holes 490 are located in pumping plate 85. As shown in particular in FIGS. 7–8, gas holes 490 are circumferentially spaced around annular opening 462 of body member 460 to facilitate uniform discharge of process gas through gas holes 490. In one configuration, one gas hole 490 is spaced a distance of 7.5° from another gas hole 490. FIG. 11 shows a magnified side plan view of a portion of pumping plate 85. FIG. 12 shows a magnified plan view of one gas hole. FIG. 12 shows gas holes 490 having concave sidewalls so that their outer diameter 496 is larger than their inner diameter 494 at both the inlet and the outlet of the gas hole. The concave sidewalls are preferably smooth to reduce the creation of turbulence of the gas that might contribute to non-uniform gas flow. The concave shape of gas holes 490 also serves to restrict the flow through each particular gas hole which contributes to increased uniformity of flow through all of the gas holes. As seen in FIGS. 11–12, gas holes 490 extend substantially straight through pumping plate 85. In one embodiment, gas holes 490 have a diameter approximately in the range of 0.120 to 0.130 inches and more preferably in the range of 0.122 to 0.125 inches.

Figure 13:
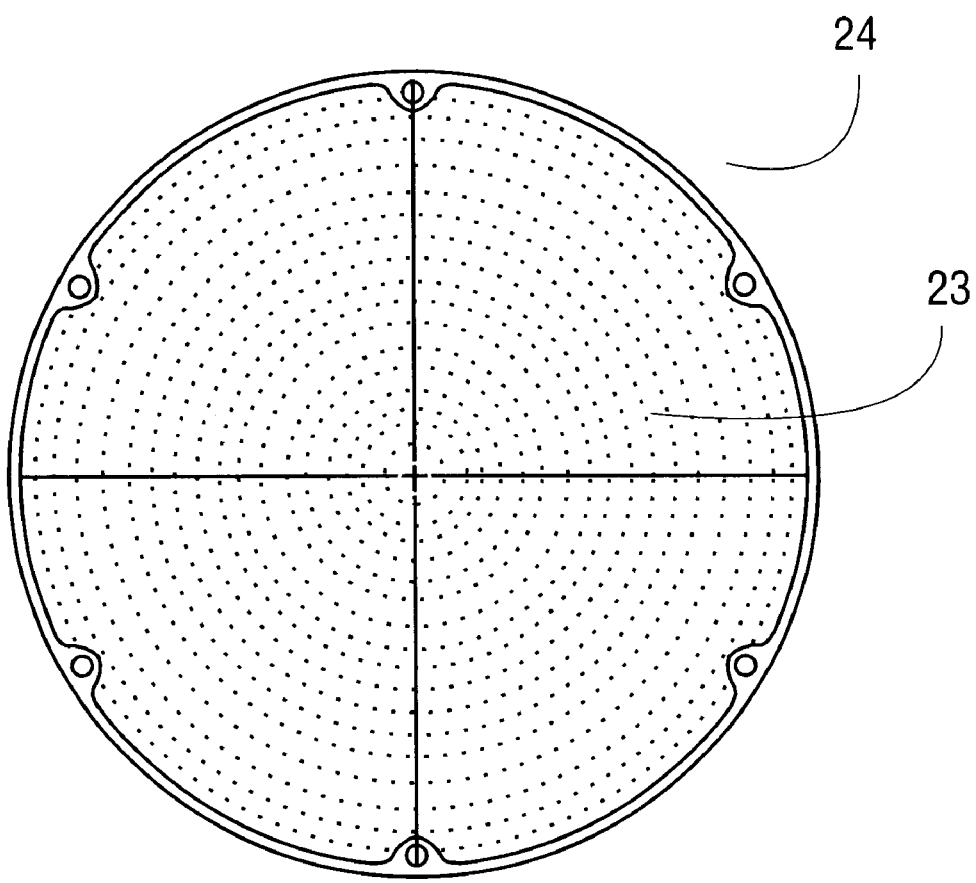
FIG. 13 shows a top plan view of a blocker plate in accordance with an embodiment of the invention.

Process gas enters the processing chamber through relatively narrow gas distribution port 20 (FIGS. 1–3). To distribute the process gas evenly, the processing chamber of the invention is equipped with blocker plate 24 and face plate 25. FIG. 13 shows a top plan view of blocker plate 24. Blocker plate 24 is substantially circular in shape and is coupled to chamber lid 30 through the circumferentially-arranged fastening holes. Blocker plate 24 has through holes 23 for coupling blocker plate 24 to perforated face plate 25. In an embodiment suitable for the eight liter processing chamber described with reference to FIGS. 1–3, blocker plate 24 has approximately 1,122 through holes 23 having a diameter in the range of 0.010 inches to 0.020 inches and preferably in the range of 0.014 inches to 0.016 inches. Through holes 23 are arranged, in this embodiment, in a generally circular pattern. Blocker plate 24 has a thickness approximately in the range of 0.180 to approximately 0.190 inches. Preferably, the thickness of blocker plate 24 is 0.185 inches. Blocker plate 24 assists in creating a uniform flow of gas in chamber body 45 by spreading the relatively narrow stream of process gas through gas distribution port 20 over the area of blocker plate 24.

Figure 14:
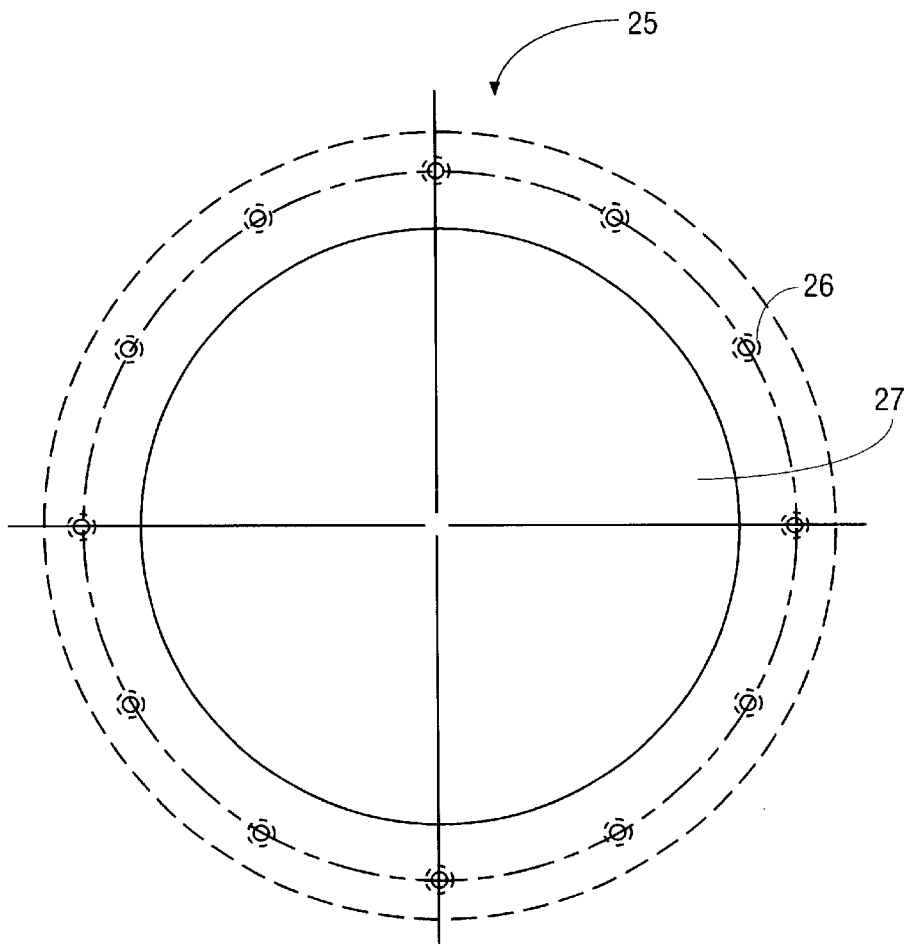
FIG. 14 shows a top plan view of a face plate in accordance with an embodiment of the invention.
Figure 15:
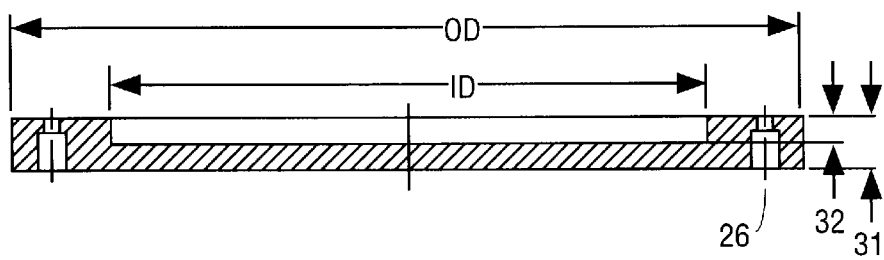
FIG. 15 shows a cross-sectional side view of a face plate in accordance with an embodiment of the invention.
Figure 16:
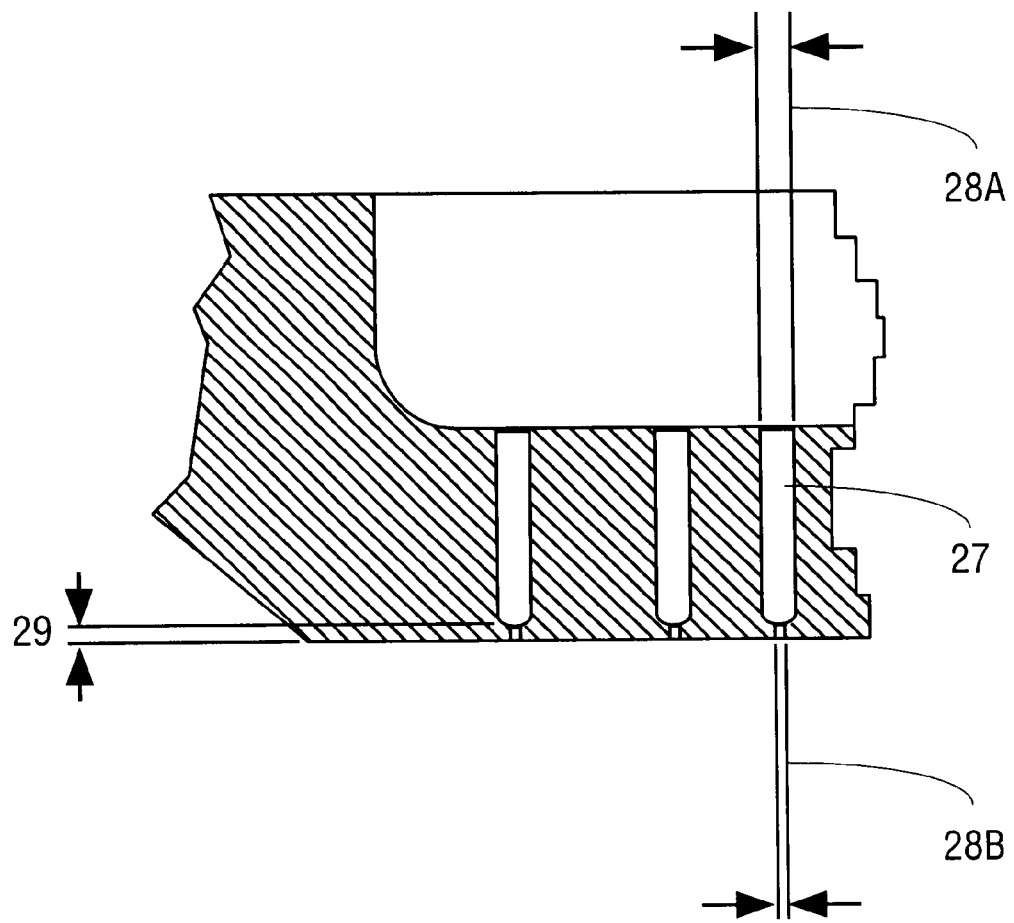
FIG. 16 shows a cross-sectional side view of a portion of a face plate in accordance with an embodiment of the invention.

FIGS. 14–15 show a top and side plan view, respectively of face plate 25. FIG. 16 shows a cross-sectional side plan view of a portion of face plate 25. Face plate 25 is circular in shape. Face plate 25 serves in one aspect to assist in the uniform distribution of process gas over a wafer. Process gas already redistributed to the circumferential area of blocker plate 24 is further restricted as the gas contacts face plate 25. In one embodiment, through holes in face plate 25 have a similar diameter as through holes in blocker plate 24.

Face plate 25 is substantially circular in shape and is coupled to chamber lid 30 through circumferentially-arranged fastening holes 26. Though holes 27 in the central portion of the face plate 25 extend through face plate 25. In the embodiment of an eight liter processing chamber described above, the inner diameter of a perforated face plate may range from approximately 9.10 to 9.30 inches and an outer diameter that may range from approximately 10.7 to 10.10 inches of perforated face plate 25. Face plate 25 includes two stepped portions. A thickness of exterior portion 31 to couple face plate 25 to a chamber is approximately 0.800 inches while the inner portion 32 having through holes 27 is approximately 0.400 inches.

In one embodiment, though holes 27 in the inlet side of perforated face plate 25 have a larger diameter than the outlet side where the process gas enters the reaction portion of the chamber. One reason for this is mechanical constraints of forming appropriate diameter through holes in the material, e.g., damaging drill bits. FIG. 16 shows the difference in diameters between the inlets and outlets of through holes 27 in perforated face plate 25. Inlet 28A to each through hole (gas inlets are located at the superior side of perforated face plate 25 adjacent to blocker plate 24) has a diameter of about 0.62 inches which is larger than outlet diameter 28B of 0.016 inches. The depth of the gas hole is approximately 0.400 inches. The smaller diameter opening has a length (numerically represented by reference numeral 29) of approximately 0.030 inches.

The method for processing a semiconductor wafer according to the invention will now be described. Wafer is first positioned onto the upper surface of susceptor 5 with a support blade (not shown) of the robotic wafer transfer system. Susceptor 5 is raised into the upper processing position within process chamber 45 via conventional means, such as a hydraulic lift, so that wafer resides within central opening of plate 85. Chamber 45 is then evacuated in a suitable vacuum pressure, while the wafer and susceptor 5 are suitably heated. Process gases, such as $SiH_4$ and $NH_3$, are mixed in a chamber of a manifold head (not shown) and introduced through inlet 20 through blocker plate 24 and distributed uniformly over wafer via perforated face plate 25. Depending on the particular process, the process gas will contact the wafer and form a film, such as an oxide or nitride film.

During the deposition process, pump 32 is activated to generate vacuum pressure within pumping channel 414, thereby drawing the process gases and/or plasma residue out of processing chamber 90 through gas holes 490 of pumping plate 85. In addition, purge gas (bottom purge gas) 1030 such as nitrogen may be directed through inlet 18 and into processing chamber 90 through the gap between susceptor and pumping plate 85. The purge gas minimizes leakage of process gas into the lower portion of the chamber. The residual gas and purge gas flow uniformly into gas holes 490 and into pumping channel 414. The exiting gases are discharged through vacuum pump-out 31 and discharged along line 33.

Pumping plate 85 separates the gas flow into two flow regions: a first flow region 1000 directed at the surface of susceptor 5 (or a wafer on susceptor 5) and a second flow region 1010 in channel 414 and in communication with channel 4140. In one aspect, the invention contemplates that a pressure difference between a pressure measured in first flow region and a pressure measured in second flow region 1030 will be similar at all points around the chamber. The consistent pressure difference contributes to a uniform flow of gas through the chamber and a more uniform film deposition on a wafer. By operating in ranges of chamber pressure greater than 100 Torr, the process offers greater flexibility in deposition rate and a reduction in temperature sensitivity across the wafer than prior processes operating in ranges of less than 100 Torr. The reduction in temperature sensitivity yields a more uniform film deposition across a wafer than prior art processes.

Referring to the drawings, a low pressure chemical vapor deposition (LPCVD) chamber is described. FIGS. 1–3 show cross-sectional views of one type of reactor such as a resistive reactor used to practice the invention. FIGS. 1–3 each show cross-sectional views of a chamber through two different cross-sections, each cross-section representing a view through approximately one-half of the chamber.

The LPCVD chamber illustrated in FIGS. 1–3 is constructed of materials such that, in this embodiment, a pressure of greater than or equal to 100 Torr can be maintained. For the purpose of illustration, a chamber of approximately in the range of eight liters is described. FIG. 1 illustrates the inside of process chamber body 45 in a "wafer-process" position. FIG. 2 shows the same view of the chamber in a "wafer-separate" position. FIG. 3 shows the same cross-sectional side view of the chamber in a "wafer-load" position. In each case, a wafer is indicated in dashed lines to indicate its location in the chamber.

FIGS. 1–3 show chamber body 45 that defines reaction chamber 90 in which the reaction between a process gas or gases and the wafer takes place (e.g., a CVD reaction). Chamber body 45 is constructed, in one embodiment, of aluminum and has passages 55 for water to be pumped therethrough to cool chamber body 45 (e.g., a "cold-wall" reaction chamber). Resident in chamber 90 is resistive heater 80 including, in this view, susceptor 5 supported by shaft 65. Susceptor 5 has a surface area sufficient to support a substrate such as a semiconductor wafer (shown in dashed lines).

Process gas enters otherwise sealed chamber 90 through gas distribution port 20 in a top surface of chamber lid 30 of chamber body 45. The process gas then goes through blocker plate 24 to distribute the gas about an area consistent with the surface area of a wafer. Thereafter, the process gas is distributed through perforated face plate 25 located, in this view, above resistive heater 80 and coupled to chamber lid 30 inside chamber 90. One objective of the combination of blocker plate 24 with face plate 25 in this embodiment is to create a uniform distribution of process gas at the substrate, e.g., wafer.

A substrate such as a wafer is placed in chamber 90 on susceptor 5 of heater 80 through entry port 40 in a side portion of chamber body 45. To accommodate a wafer for processing, heater 80 is lowered so that the surface of susceptor 5 is below entry port 40 as shown in FIG. 3. Typically by a robotic transfer mechanism, a wafer is loaded by way of, for example, a transfer blade into chamber 90 onto the superior surface of susceptor 5. Once loaded, entry port 40 is sealed and heater 80 is advanced in a superior (e.g., upward) direction toward face plate 25 by lifter assembly 60 that is, for example, a step motor. The advancement stops when the wafer is a short distance (e.g., 400–700 mils) from face plate 25 (see FIG. 1). In the wafer-process position, chamber 90 is effectively divided into two zones, a first zone above the superior surface of susceptor 5 and a second zone below the inferior surface of susceptor 5. It is generally desirable to confine the film formation to the first zone.

At this point, process gas controlled by a gas panel flows into chamber 90 through gas distribution port 20, through blocker plate 24 and perforated face plate 25. Process gas typically reacts or contacts a wafer to form a film on the wafer. At the same time, an inert bottom-purge gas, e.g., nitrogen, is introduced into the second chamber zone to inhibit film formation in that zone. In a pressure controlled system, the pressure in chamber 90 is established and maintained by a pressure regulator or regulators coupled to chamber 90. In one embodiment, for example, the pressure is established and maintained by baretone pressure regulator (s) coupled to chamber body 45 as known in the art. In this embodiment, the baretone pressure regulator(s) maintains pressure at a level of equal to or greater than 100 Torr. A suitable mid-level pressure range is approximately 100–300 Torr.

Residual process gas is pumped from chamber 90 through pumping plate 85 to a collection vessel at a side of chamber body 45 (vacuum pumpout 31). Pumping plate 85 creates two flow regions resulting in a gas flow pattern that creates a uniform $Si_3N_4$ layer on a substrate.

Pump 32 disposed exterior to apparatus 2 provides vacuum pressure within pumping channel 4140 (below channel 414 in FIGS. 1–3) to draw both the process and purge gases out of the chamber 90 through vacuum pumpout 31. The gas is discharged from chamber 90 along a discharge conduit 33. The flow rate of the discharged gas through channel 4140 is preferably controlled by a throttle valve 34 disposed along conduit 33. The pressure within processing chamber 90 is monitored with sensors (not shown) and controlled by varying the cross-sectional area of conduit 33 with throttle valve 34, Preferably, a controller or processor receives signals from the sensors that indicate the chamber pressure and adjusts throttle valve 34 accordingly to maintain the desired pressure within chamber 90. A suitable throttle valve for use with the present invention is described in U.S. Pat. No. 5,000,225 issued to Murdoch and assigned to Applied Materials, Inc., the complete disclosure of which is incorporated herein by reference.

Once wafer processing is complete, chamber 90 may be purged, for example, with an inert gas, such as nitrogen. After processing and purging, heater 80 is advanced in an inferior direction (e.g., lowered) by lifter assembly 60 to the position shown in FIG. 2. As heater 80 is moved, lift pins 95, having an end extending through openings or throughbores in a surface of susceptor 5 and a second end extending in a cantilevered fashion from an inferior (e.g., lower) surface of susceptor 5, contact lift plate 75 positioned at the base of chamber 90. As is illustrated in FIG. 2, in one embodiment, at this point, lift plate 75 remains at a wafer-process position (i.e., the same position the plate was in FIG. 1). As heater 80 continues to move in an inferior direction through the action of Her assembly 60, lift pins 95 remain stationary and ultimately extend above the superior or top surface of susceptor 5 to separate a processed wafer from the surface of susceptor 5. The surface of susceptor 5 is moved to a position below opening 40.

Once a processed wafer is separated from the surface of susceptor 5, transfer blade 41 of a robotic mechanism is inserted through opening 40 beneath the heads of lift pins 95 and a wafer supported by the lift pins. Next, lifter assembly 60 inferiorly moves (e.g., lowers) heater 80 and lift plate 75 to a "wafer load" position. By moving lift plate 75 in an inferior direction, lift pins 95 are also moved in an inferior direction, until the surface of the processed wafer contacts the transfer blade, The processed wafer is then removed through entry port 40 by, for example, a robotic transfer mechanism that removes the wafer and transfers the wafer to the next processing step. A second wafer may then be loaded into chamber 90. The steps described above are generally reversed to bring the wafer into a process position. A detailed description of one suitable lifter assembly 60 is described in U.S. Pat. No. 5,772,773, assigned to Applied Materials, Inc., of Santa Clara, Calif.

In a high temperature operation, such as LPCVD processing to form a Si$_3$N$_4$ film, the reaction temperature inside chamber 90 can be as high as 750° C. or more. Accordingly, the exposed components in chamber 90 must be compatible with such high temperature processing. Such materials should also be compatible with the process gases and other chemicals, such as, cleaning chemicals (e.g., NF$_3$) that may be introduced into chamber 90. Exposed surfaces of heater 80 may be comprised of a variety of materials provided that the materials are compatible with the process. For example, susceptor 5 and shaft 65 of heater 80 may be comprised of similar aluminum nitride material. Alternatively, the surface of susceptor 5 may be comprised of high thermally conductive aluminum nitride material (on the order of 95% purity with a thermal conductivity from 140 W/mK to 200 W/mK) while shaft 65 is comprised of a lower thermally conductive aluminum nitride- Susceptor 5 of heater 90 is typically bonded to shaft 65 through diffusion bonding or brazing as such coupling will similarly withstand the environment of chamber 90.

FIG. 1 also shows a cross-section of a portion of heater 80, including a cross-section of the body of susceptor 5 and a cross-section of shaft 65, In this illustration. FIG. 1 shows the body of susceptor 5 having two heating elements formed therein, first heating element 50 and second heating element 57. Each heating element (e.g., heating element 50 and heating element 57) is made of a material with thermal expansion properties similar to the material of the susceptor. A suitable material includes molybdenum (Mo). Each heating element includes a thin layer of molybdenum material in a coiled configuration.

In FIG. 1, second heating element 57 is formed in a plane of the body of susceptor 5 that is located inferior (relative to the surface of susceptor in the figure) to first heating element 50. First heating element 50 and second heating element 57 are separately coupled to power terminals. The power terminals extend in an inferior direction as conductive leads through a longitudinally extending opening through shaft 65 to a power source That supplies the requisite energy to heat the surface of susceptor 5. Extending through openings in chamber lid are two pyrometers, first pyrometer 10 and second pyrometer 15. Each pyrometer provides data about the temperature at the surface of susceptor 5 (or at the surface of a wafer on susceptor 5). Also of note in the cross-section of heater 80 as shown in FIG. 1 is the presence of thermocouple 70. Thermocouple 70 extends through the longitudinally extending opening through shaft 65 to a point just below the superior or top surface of susceptor 5.

In accordance with one embodiment of the invention to form a Si$_3$N$_4$ film on a wafer, the gases include a carrier gas 200, a nitrogen source gas 220, and a silicon source gas 210. Suitable carrier gas sources include, but are not limited to, hydrogen (H$_2$), nitrogen (N$_2$), argon (Ar), and helium (He). Suitable nitrogen source gas includes, but is not limited to, ammonia (NH$_3$) Suitable silicon source gas includes, but is not limited to, silane, dichlorosilane, and disilene. The nitrogen source gas and the silicon source gas combine to produce a Si$_3$N$_4$ layer on the wafer.

In use, silicon source gas 210 may he mixed with carrier gas 200 before or during introduction into the processing chamber 90. The mixture of the carrier gas and the silicon source gas is then introduced into gas inlet 20 of chamber 90. Nitrogen source gas 220 is also introduced into gas inlet 20 and allowed to mix with the mixture of the carrier gas and the silicon source gas. The process gas passes through the plurality of holes in a blocker plate 24 and then through the plurality of holes in the face plate 25, These gases then flow into chamber 90 wherein the gases are exposed to a wafer. Thereafter, the process gas exits through the pumping plate 85 into the pumping channel 414.

The flow rate of the gases is dependent upon the size of semiconductor processing chamber 90. In one embodiment, the total flow rate of the gases ranges from five to fifteen liters per minute based upon a total effective volume of a processing chamber of one to nine liters. The ratio of at least one of the gases or the total gas flow rate relative to the chamber is 0.50 to 8 liters per minute per liter of chamber volume.

Exposure of the wafer to the mixture of gases causes deposition of a silicon nitride (Si$_3$N$_4$) layer on the wafer according to thermal chemical vapor deposition principles, Exposure of the gases to the wafer at an elevated temperature causes dissociation of the molecules of the silicon source gas and the nitrogen source gas into smaller molecules. The smaller molecules then recombine with one another. Provided below is a general chemical reaction that occurs in this process. Silane generally reacts with ammonia according to the chemical equation

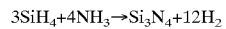

$$3SiH_4 + 4NH_3 \rightarrow Si_3N_4 + 12H_2$$

As a general rule, the higher the temperature in chamber 90, and therefore of wafer and susceptor, the quicker the silicon nitride layer will form.

In one embodiment, SiH$_4$, NH$_3$, and N$_2$ are introduced with 100 standard cubic centimeters per minute (sccm) of SiH$_4$, 5 standard liters per minute (slm) of NH$_3$, and 10 slm of N$_2$, while wafer is heated to a temperature of between 600° C. and 800° C. During deposition, pressure in the chamber of between 100 to 500 Torr is maintained. A suitable mid-level pressure range is greater than 100 Torr to 350 Torr. In one embodiment, the partial pressure of silane is approximately in the range of 0.05 to 5 Torr and ammonia has a partial pressure equal to or less than 300 Torr in chamber. However, other partial pressures may be used for the silicon and nitrogen source gases which may depend upon the particular gas used.

In another embodiment, gases may by used in the following proportions: SiH$_4$: 70 sccm, NH$_3$: 2 slm and N$_2$: 8 slm. In yet another embodiment, gases may be used in the following proportions: dichlorosilane (SiH$_2$Cl$_2$): 230 sccm, NH$_3$: 1,000 sccm, and H$_2$: 9,000 sccm. If N$_2$: is used as a carrier gas, a deposition rate of about 50 to 5,000 Å per minute may be achieved at a temperature as low as 600° C.

The above embodiment described controlling conditions in a reaction chamber to form a Si$_3$N$_4$ film on a wafer. It is to be appreciated that such control may be done manually or with the aid of a system controller. In the former instance, an operator may monitor and adjust the power supply to the heater to control the temperature, and a vacuum source to control the pressures. The operator may also manually adjust valves associated with the individual gases to regulate the mixture and flow rate of the gases.

A system controller may also be employed to handle the control tasks associated with system control. FIG. 1 illustrates a system controller or processor coupled to a power supply and a gas manifold. The controller may be configured to record the temperature measured by the temperature indicators and control the power supplied to the heating elements based, for example, on an algorithm that determines a relative value of the temperature difference and adjusts the heating elements accordingly. The controller may also be configured to control the mixture and flow of gases to the processing chamber. In an LPCVD reaction process, the controller may further be coupled to a pressure indicator that measures the pressure in the chamber as well as a vacuum source to adjust the pressure in the chamber.

The system controller is supplied with control signal generation logic. The controller may also be coupled to a user interface that allows an operator to enter the reaction parameters, such as the desired reaction temperature, the acceptable tolerance of a temperature difference between indicators (e.g., ±3° C.), the reaction pressure, and the flow of gases to the processing chamber.

Control signal generation logic is supplied to the system controller in the form of, for example, software instruction logic that is a computer program stored in a computer-readable medium such as the memory of the controller. The computer program includes sets of instructions that dictate the timing, mixture of gases, chamber pressure, chamber temperature, and other parameters of a particular process. It is to be appreciated that other computer programs such as one stored on another memory device, including but not limited to, a floppy disk, may also be used to operate the system, controller.

The computer program code can be written in a computer-readable programming language such as, for example, 68000 assembly language, C, C++, Pascal, Fortran or others. Suitable program code is generally entered into a single file or multiple files using a text editor. If the entered code text is in a high level language, the code is compiled, and the resultant compiler code is then linked with an object code or precompiled object code, the system invokes the object code, causing the computer system to load the code in memory, from which the central processing unit reads and executes the code to perform the task identified in the program.

In one aspect of the invention, an apparatus and method of improving the uniformity of process/reactant gas distribution is described. As described above, process gas such as a silicon source gas and a nitrogen source gas (along with a carrier gas) is introduced into chamber 90 through gas distribution port 20. The process gas flows through blocker plate 24 and face plate 25 which create a shower-head like cascade of the process gas over a surface of a wafer on the surface of susceptor 5. As gas is introduced into chamber 90 gas is also removed so that a pre-determined pressure may be maintained during processing. In the configuration of the chamber shown in FIGS. 1–3, gas is removed from a side of the chamber, e.g., pumped out at one side designated vacuum pump-out 31. In prior art systems, the asymmetrical removal of gases from one side of the chamber created pressure differences in the chamber; for example, a pressure measured at a point in the chamber nearer a chamber pump-out was different (e.g., less) than a pressure measured at a point distant from the pump-out. The pressure difference contributed to non-uniformity of deposition of a film on a wafer.

In one embodiment of the invention, a pumping plate is provided to direct the flow of gases in the chamber. The pumping plate of the invention defines two gas flow regions: a first flow region of process gases directed at a wafer on the surface of susceptor 5 and a second flow region defined by a radial channel about the pumping plate of gases primarily to be discharged from the chamber. By creating the two regions, a more uniform pressure may be maintained in the chamber. The invention contemplates that a static pressure difference between the two flow regions can be established throughout the chamber contributing to more uniform deposition of films across a wafer.

Referring to FIGS. 4 through 10, components of the invention utilized to coordinate a uniform flow of process gas in the chamber will now be described in detail relative to their Use in the resistively-heated processing chamber described in FIGS. 1 through 3. FIG. 4 shows a schematic cross-sectional side view of a portion of a processing chamber. FIG. 4 illustrates a portion of a chamber in a position through a single cross-section to illustrate the two gas flow regions. The cross-section is through a center axis of the chamber to illustrate the location of susceptor 5 relative to pumping plate 85. In the wafer-process position, a portion of susceptor 5 sits within an annular opening of pumping plate 85 (a portion of pumping plate 85 surrounding susceptor 5 is cut-away in this cross-section).

As seen in the illustration in FIG. 4, pumping plate 85 rests on inner chamber portion 41 of chamber wall 45. An underside of pumping plate 85 and inner chamber portion 41 defines channel 4140 extending circumferentially around the chamber. Channel 4140 does not extend completely around the chamber as a portion of a similar chamber area is utilized by entry port 40 to load and remove a wafer. In one embodiment, channel 4140 extends approximately 270° around the chamber. Vacuum pump-out 31 is linked to channel 4140 to discharge gases from the chamber.

As shown in FIG. 4, pumping plate 85 includes (in this view) a vertical annular first stepped portion 464 that forms a circumferential edge of a longitudinal or vertical wall to, face plate 25. Second stepped portion 466 comprises a lateral portion that protrudes from the circumferential edge. Together, first sopped portion 464 and second stepped portion 466 define channel 414 between face plate 25, chamber wall 40 and pumping plate 85. The vertical wall separates first flow region 1000 where process gas is directed at a wafer (to be seated in wafer packet 6 of susceptor 5) from second region 1010 where gas is discharged from the chamber. Gas from first flow region 1000 enters second flow region 1010 through circumferentially locate holes (gas holes 490) extending around first portion 464 of pumping plate 85. The flow of gas in second flow region 1010 is radial and second flow region 1010 communicates with channel 4140 to remove gas from the chamber.

FIGS. 5 and 6 show schematic views of the general flow direction of process gases through the chamber. FIG. 5 is a cross-section through the chamber that shows pumping plate 85 surrounding a portion of susceptor 5. In FIG. 5, process gas is illustrated entering through the gas inlet or the chamber and passing through blocking plate 24 and face plate 25. In first flow region 1000, process gas arrives at the surface of susceptor 5 to react with a wafer in pocket 6 of susceptor 5 and form a film of, for example, $Si_3N_4$ or other desired material (e.g., $SiO_2$, polysilicon, etc.). Residual process gas as well as bottom purge gas 1030 is directed to second flow region 1010 to be discharged from the chamber. Gas enters second flow region 1010 by gas holes 490 circumferentially spaced around pumping plate 85. In this embodiment, the gas holes 490 are positioned to be above the top surface of a wafer on susceptor 5 during processing. In general, gas holes 490 are positioned at least at the level of a wafer or above the wafer when the heater is in the "wafer process" position.

FIG. 6 further shows the process flow of gas entering and exiting pumping plate 85. FIG. 6 is a top perspective view without the resistive heater, the chamber lid, blocking plate, and face plate. FIG. 6 shows generally U-shaped pumping channel 414 that substantially surrounds a susceptor and defines second flow region 1010. Radially oriented gas holes 4941 are positioned around the entire perimeter of the pumping plate and communicate with pumping channel 414. Gas holes 490 in the side wall of pumping plate 85 allow gas to flow horizontally into pumping channel 414. Pumping channel 414 communicates with channel 414l) through two large openings in channel 414; openings defined by the absence of sections of lateral second stepped portion 466 of pumping plate 85. Second stepped portion 466 is comprised of two flange portions (see FIG. 7). One flange portion isolates channel 414 from entry port 40 while a second flange portion separates channel 414 from a region of channel 4140 occupied by vacuum pump-out 31. Configuring the flange portions in this manner helps to maintain a uniform pressure in channel 414.

Gas holes 490 in first stepped portion 464 of pumping plate 85 are shown in FIG. 6 substantially evenly spaced apart from one another. Additionally, the gas holes are generally centered in first stepped portion 464 of pumping plate 85. The placement of gas holes 498 in the side wall of pumping plate 85 and the division of first flow region 1000 and second flow region 1010 creates a consistent pressure difference between first flow region 1000 and second flow region 1010. This feature allows the gas flow within the chamber to he more uniform than prior art configurations. In the prior art, a pumping plate had varying pressure differentials at various points along the pumping plate which resulted in non-uniform gas flow regions.

FIGS. 7–12 illustrate different views of an embodiment, or a portion of an embodiment, of a pumping plate of the invention. FIG. 7 illustrates a perspective top view, FIG. 8 a planar side view, FIG. 9 a planar top view, and FIG. 10 a planar bottom view. FIGS. 11–12 show portions of the pumping plate to more clearly describe certain features.

Pumping plate 85 comprises generally annular member 460. In one embodiment, member 460 is an integral piece comprising a process compatible metal, such as aluminum alloy or preferably C275 aluminum alloy, that will be suitably shaped to fit within a particular semiconductor processing chamber. C275 aluminum alloy is commercially available from Alcoa Advanced Technologies of Engelwood, Colo. Although member 460 is preferably constructed of a single integral piece of metal with different portions or member 460, the pumping plate 85 may be comprised of pieces connected or coupled together.

In the specific configuration described herein, member 460 includes first stepped portion 464, second stepped portion 466, and third stepped portion 469. First stepped portion 464 forms a vertical side wall to define channel 414 and separate second flow region 1010 from first flow region 1000. Second stepped portion 466 defines the lateral portion or floor of pumping channel 414. Third stepped portion 468 serves to align pumping plate 85 in a predetermined position within a processing chamber.

In the eight liter processing chamber described with reference to FIGS. 1–3, the thickness of first stepped portion 469 ranges from approximately 0.06 inches to 0.10 inches and is preferably 0.06 inches. With reference FIGS. 8–9, inner diameter $ID_{10}$ of second stepped portion 466 is, for example, 9.572 inches, and the outer diameter $OD_{10}$ is, for example, 11.25 inches. Inner diameter $ID_{10}$ of second stepped portion 466 is slightly larger than the diameter of susceptor 5 so that susceptor 5 will fit within the opening in annular member 460 of pumping plate 85. In one embodiment, there is approximately 0.12 to 0.18 inches spacing between susceptor 5 and second stepped portion 466. $ID_{20}$ of first stepped portion 464 is 10.4 inches. $OD_{20}$ of first stepped portion 464 is 10.9 inches. As Shown in FIG. 11, height 488 of pumping plate 85 in this embodiment is 1.20 inches. The distance between base 489 of the pumping plate (the base of third stepped portion 468) and the central point of gas hole 490 extending through the first stepped portion 464 is 0.728 inches.

Second stepped portion 466 comprises two flange portions which extend the outside diameter from $OD_{10}$ to $OD_{11}$. $OD_{11}$ ranges from a diameter of 12.93 inches. Each flange portion has an area in proportion to an arc defined between two radii of first and second portion of annular member 460, respectively. FIG. 9 shows each flange with a bi-section having an area in proportion to an arc of 55°.

The flange portions of second stepped portion 466 (i.e., the lateral portions) define the base of channel 414 and second flow region 1010. Between each flange portion are provided openings to channel 4140 and vacuum pump-out 31. In one embodiment, an area between flange portions is in proportion to an arc of 72°.

As illustrated by the bottom plan view of FIG. 10, third stepped portion creates a seat for pumping plate 85 to rest on inner chamber portion 41. In this embodiment, third stepped portion 468 includes a single lip portion coinciding with an area similar to an area of one of the flange portions of second stepped portion 466. The lip portion serves, in one aspect, to orient pumping plate 85 in the chamber.

The diameters of the first, second, and third stepped portions of the pumping plate will depend on the characteristics of the individual deposition apparatus, such as the diameter of the perforated face plate 25, the radial distance between pumping channel 414 and chamber 90, the height of susceptor 5 (i.e., the axial distance between channel 414 and chamber 90), and the diameter of the susceptor 5.

Pumping plate 85 comprises a plurality of gas holes 490 through the side wall of first stepped portion 464 that communicate first flow region 1000 with channel 414 and second flow region 1010. In one embodiment, forty-eight gas holes 490 are located in pumping plate 85. As shown in particular in FIGS. 7–8, gas holes 490 are circumferentially spaced around annular opening 462 of body member 460 to facilitate uniform discharge of process gas through gas holes 490. In one configuration, one gas hole 490 is spaced a distance of 7.5° from another gas hole 490. FIG. 11 shows a magnified side plan view of a portion of pumping plate 85. FIG. 12 shows a magnified plan view of a portion of pumping plate 85 identified by reference numberal 491 in FIG. 7 and including one gas hole. FIG. 12 shows gas hole 490 having concave sidewalls so that its outer diameter 496 is larger than its inner diameter 494 at both the inlet and the outlet of the gas hole. The concave sidewalls are preferably smooth to reduce the creation of turbulence of the gas that might contribute to non-uniform gas flow. The concave shape of gas holes 490 also serves to restrict the flow through each particular gas hole which contributes to increased uniformity of flow through all of the gas holes. As seen in FIGS. 11–12, gas holes 490 extend substantially straight through pumping plate 85. In one embodiment, gas holes 490 have a diameter approximately in the range of 0.120 to 0.130 inches and more preferably in the range of 0.122 to 0.125 inches.

Process gas enters the processing chamber through relatively narrow gas distribution port 20 (FIGS. 1–3). To distribute the process gas evenly, the processing chamber of the invention is equipped with blocker plate 24 and face plate 25. FIG. 13 shows a top plan view of blocker plate 24. Blocker plate 24 is substantially circular in shape and is coupled to chamber lid 30 through the circumferentially-arranged fastening holes. Blocker plate 24 has through holes 23 for coupling blocker plate 24 to perforated face plate 25. In an embodiment suitable for the eight liter processing chamber described with reference to FIGS. 1–3, blocker plate 24 has approximately 1,122 through holes 23 having a diameter in the range of 0.010 inches to 0.020 inches and preferably in the range of 0.014 inches to 0,016 inches. Through holes 23 are arranged, in this embodiment, in a generally circular pattern. Blocker plate 24 has a thickness approximately in the range of 0.180 to approximately 0.190 inches, Preferably, the thickness of blocker plate 24 is 0.195 inches. Blocker plate 24 assists in creating a uniform flow of gas in chamber body 45 by spreading the relatively narrow stream of process gas through gas distribution port 20 over the area of blocker plate 24.

FIGS. 14–15 show a top and side plan view, respectively of face plate 25. FIG. 16 shows a cross-sectional side plan view of a portion of face plate 25. Face plate 25 is circular in shape. Faceplate 25 serves in one aspect to assist the uniform distribution of process gas over a wafer. Process gas already redistributed to the circumferential area of blocker plate 24 is further restricted as the gas contacts face plate 25. In one embodiment, through holes in face plate 25 have a similar diameter as through holes in blocker plate 24.

Face plate 25 is substantially circular in shape and is coupled to chamber lid 30 through circumferentially-arranged fastening holes 26. Though holes 27 in the central portion of the face plate 25 extend through face plate 25. In the embodiment of an eight liter processing chamber described above, the inner diameter of a perforated face plate may range from approximately 9, 10 to 9.30 inches and an outer diameter that may range from approximately 10.7 to 10.10 inches of perforated face plate 25. Face plate 25 includes two stepped portions. A thickness of exterior portion 31 to couple face plate 25 to a chamber is approximately 0.800 inches while the inner portion 32 having through holes 27 is approximately 0.400 inches.

In one embodiment, though holes 27 in the inlet side of perforated face plate 25 have a larger diameter than the outlet side where the process gas enters the reaction portion of the chamber. One reason for this is mechanical constraints of forming appropriate diameter through holes in the material, e.g., damaging drill bits. FIG. 16 shows the difference in diameters between the inlets and outlets of through holes, 27 in perforated face plate 25. Inlet 28A to each through hole (gas inlets are located at the superior side of perforated face plate 25 adjacent to blocker plate 24) has a diameter of about 0.62 inches which is larger than outlet diameter 28B of 0.016 inches. The depth of the gas hole is approximately 0.400 inches. The smaller diameter opening has a length (numerically represented by reference numeral 29) of approximately 0.030 inches.

The method for processing a semiconductor wafer according to the invention will now be described. Wafer is first positioned onto the upper surface of susceptor 5 with a support blade (not shown) of the robotic wafer transfer system. Susceptor 5 is raised into the upper processing position within process chamber 45 via conventional means, such as a hydraulic lift, so that wafer resides within central opening of plate 85. Chamber 45 is then evacuated to a suitable vacuum pressure, while the wafer and susceptor 5 are suitably heated. Process gases, such as SiH$_4$ and NH$_3$, are mixed in a chamber of a manifold head (not shown) and introduced through inlet 20 through blocker plate 24 and distributed uniformly over wafer via perforated fare plate 25. Depending on the particular process, the process gas will contact the wafer and form a film, such as an oxide or nitride film.

During the deposition process, pump 32 is activated to generate vacuum pressure within pumping channel 414, thereby drawing the process gases and/or plasma residue out of processing chamber 90 through gas holes 490 of pumping plate 85. In addition, purge gas (bottom purge gas) 1030 such as nitrogen may be directed through inlet 18 and into processing chamber 90 through the gap between susceptor and pumping plate 85. The purge gas minimizes leakage of process gas into the lower portion of the chamber. The residual gas and purge gas flow uniformly into gas holes 490 and into pumping channel 414. The exiting gases are discharged through vacuum pump-out 31 and discharged along line 33.

Pumping plate 85 separates the gas flow into two flow regions: a first flow region 1000 directed at the surface of susceptor 5 (or a wafer on susceptor 5) and a second flow region 1010 in channel 414 and in communication with channel 4140. In one aspect, the invention contemplates that a pressure difference between a pressure measured in first flow region and a pressure measured in second flow region 1030 will be similar at all points around the chamber. The consistent pressure difference contributes to a uniform flow of gas through the chamber and a more uniform film deposition on a wafer. By operating in ranges of chamber pressure greater than 100 Torr, the process offers greater flexibility in deposition rate and a reduction in temperature sensitivity across the wafer than prior processes operating in ranges of less than 100 Torr. The reduction in temperature sensitivity yields a more uniform film deposition across a wafer than prior art processes.

Figure 17:
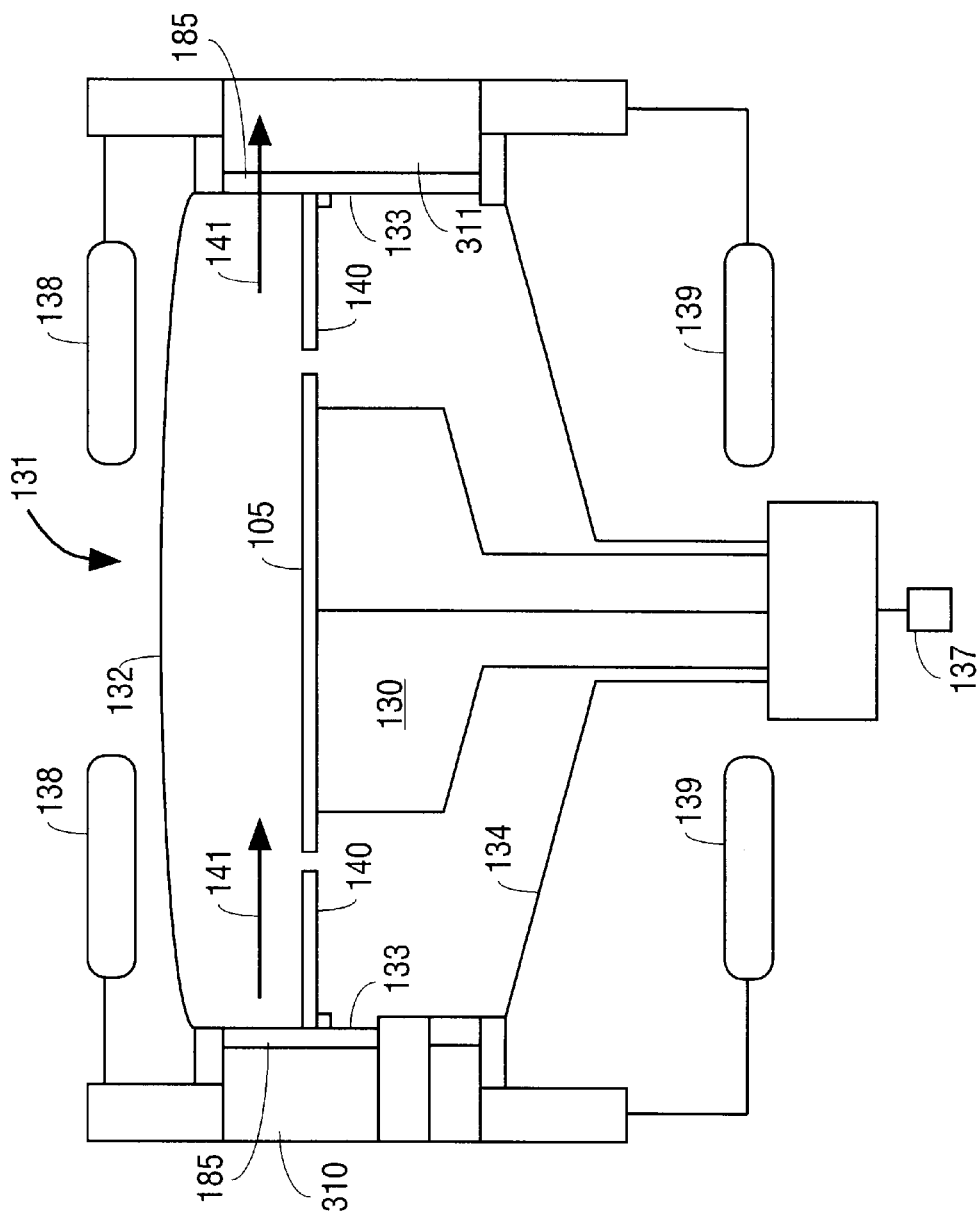
FIG. 17 is a cross-sectional schematic view of a single substrate radiantly-heated deposition chamber.

FIG. 17 illustrates an example of a radiantly-heated processing chamber. Although heretofore such chambers have been used at process pressures less than or approaching 100 Torr, their use may also be suitable for higher pressure processes. Design considerations for operating at pressures greater than 100 Torr are to be contemplated. The single substrate reactor 131 includes top wall 132, sidewalls 133 and bottom wall 134 that define the reactor 131 into which a single substrate, such as a wafer, can be loaded. The wafer is mounted on susceptor 105 that is rotated by motor 137 to provide a time averaged environment for the wafer that is cylindrically symmetric. Preheat ring 140 is supported in the chamber 130 and surrounds the wafer. The wafer and preheat ring 140 are heated by light from a plurality of high intensity lamps 138 and 139 mounted outside of reactor 131. Top wall 132 and bottom wall 134 of chamber 130 are substantially transparent to light to enable the light from external lamps 139 and 139 to enter reactor 131 and heat susceptor 105, the wafer, and preheat ring 140. Quartz is a useful material for top wall 132 and bottom wall 134 because it is transparent to light of visible and infrared (IR) frequencies; it is a relatively high strength material that can support a large pressure difference across these walls; and because it has a low rate of outgassing.

During deposition, the reactant gas stream flows from a gas input port across preheat ring 140 where the reactant gases are heated across the surface of the wafer in the direction of the arrows 141 to deposit the desired films thereon, and into exhaust port 311. The gas input port is connected to a gas manifold (not shown) that provides one or a mixture or gases to enter reactor 131 via a plurality of pipes into this port. The locations of the input ends of these pipes, the gas concentrations and/or flow rates through each of these pipes are selected to produce reactant gas flows and concentration profiles that optimize processing uniformity. Although the rotation of the substrate and thermal gradients caused by the heat from lamps 138 and 139 can affect the flow profile of the gases in reactor 131, the dominant shape of the flow profile is a laminar flow from the gas input port and across preheat ring 140 and the wafer to exhaust port 311. In one embodiment, the temperature of the wafer may range from approximately 600° C. to approximately 800° C. The pressure in the chamber may range from approximately 100 to approximately 500 Torr with a suitable mid-level pressure range of greater than 100 Torr to 350 Torr. Again, it is to be appreciated that higher pressures (e.g. approaching 500 Torr) contribute to deposition rate flexibility and reduced temperature sensitivity across the wafer.

Figure 18:
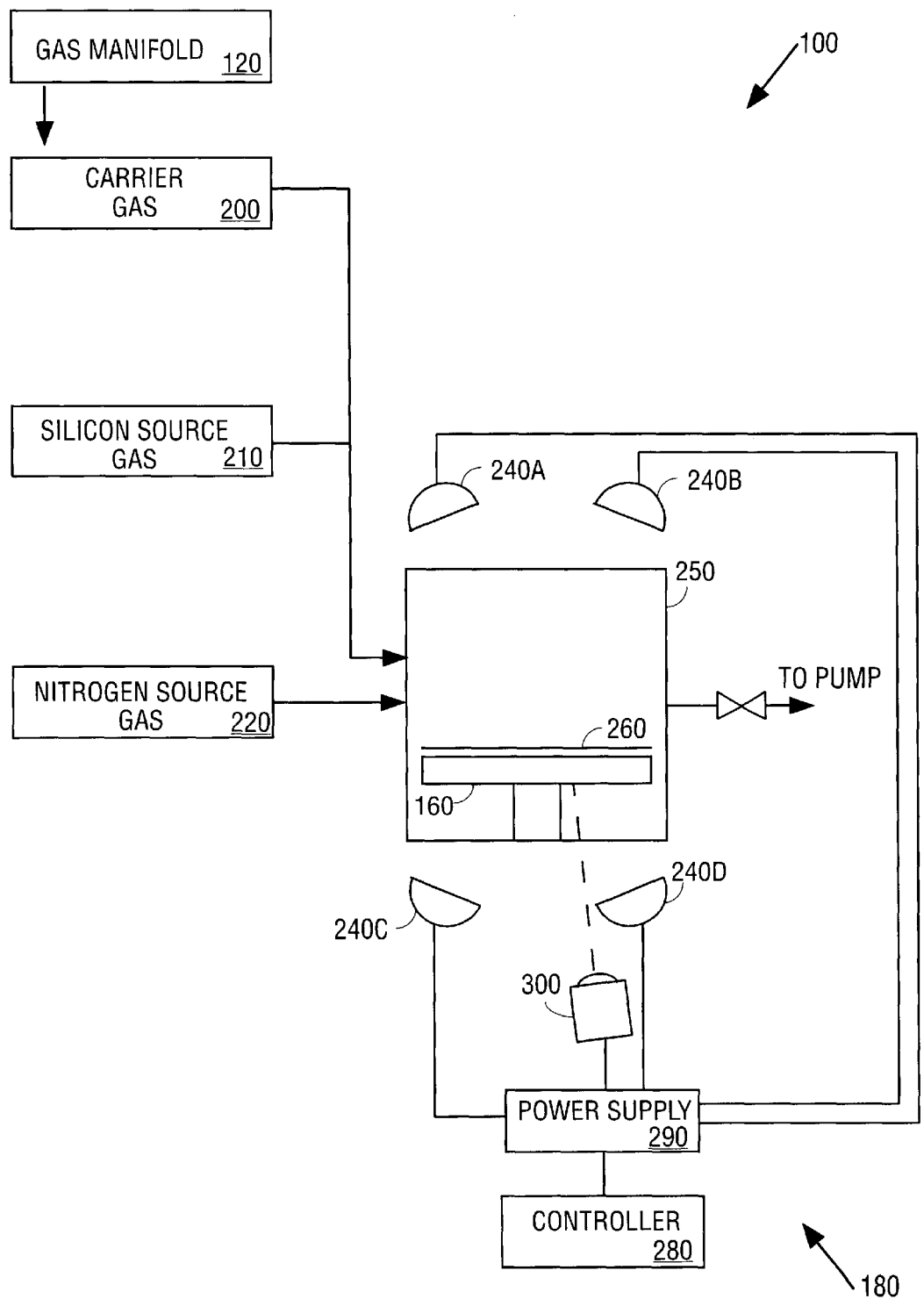
FIG. 18 is a schematic block diagram illustrating a system used for carrying out a method according to one embodiment of the invention.

FIG. 18 is a block diagram illustrating System 100 for carrying out a method according to the invention in a radiantly-heated processing chamber such as described with respect to FIG. 17. System 100 includes gas manifold 120, processing chamber 250 housing susceptor 160, and system 180 for heating the confines of semiconductor processing chamber 250, and, in this example, a radiant heat system. Processing chamber 250 has a slit (not shown) through which substrate (e.g., wafer) 260 is insertable into processing chamber 250 and then located on susceptor 160. A portion of processing chamber 250 may be made of transparent material such as quartz or the like.

System 180 for heating the confines of semiconductor processing chamber 250 includes heat lamps 240A, 240B, 240C, and 240D located above and below the processing chamber 250 and positioned to direct light energy into semiconductor processing chamber 250, temperature detector 300, such as a pyrometer or thermal camera, that measures a temperature within processing chamber 250, and controller 280.

Temperature detector 300 is positioned and aligned to detect a temperature on a lower surface of the susceptor Temperature defector 300 sends a signal to controller 290 which is indicative of the temperature measured on susceptor 160. Controller 280 is connected to power supply 290, Controller 280 adjusts power supplied by power supply 290 to respective heat lamps 240A. 240B, 240C, 240D depending on the temperature measured by temperature detector 300. For example, if the measured temperature drops too low, power supplied to heat lamps 240A, 240B, 240C, 240D would be increased. Power supplied to the respective heat lamps 240A. 240B, 240C, or 240D may be selected differently from one another.

Gas manifold 120 is capable of supplying multiple gases (e.g., three) to the processing chamber 250. In this example, the gases include carrier gas 200, nitrogen source gas 220, and silicon source gas 210. Suitable carrier gas sources include but are not limited to hydrogen ($H_2$), nitrogen ($N_2$), argon (Ar), and helium (He). Suitable nitrogen source gas includes but is not limited to ammonia ($NH_3$). Suitable silicon source gas includes but is not limited to silane, dichlorosilane, and disilane. The nitrogen source gas and the silicon source gas combine to produce a $Si_3N_4$ layer on the wafer 260.

In use, silicon source gas 210 may be mixed with carrier gas 200 before or during introduction into processing chamber 250. The mixture of the carrier gas and the silicon source gas is then introduced into a base ring (not shown) of semiconductor processing chamber 250. Nitrogen source gas 220 is also introduced into the base ring and allowed to mix with the mixture of the carrier gas and the silicon source gas. These gases flow into the semiconductor processing chamber 250 wherein the gases are exposed to wafer 260. The flow rate of the gases is dependent upon the size of processing chamber 250. In one embodiment, the total flow rate of the gases ranges from five to fifteen liters per minute based upon a total effective volume of a processing chamber of one to nine liters. The ratio of at least one of the gases or the total gas flow rate relative to the chamber is 0.7 to 5 liters per minute per liter. Exposure of the wafer to the mixture of gases causes, deposition of a silicon nitride ($Si_3N_4$) layer on wafer 260 according to thermal chemical vapor deposition principles. The wafer is heated by lamps 240A and 2408 and by the susceptor 160. Lamps 240C and 240D also may be used for generating heat in the chamber. Exposure of the gases to the wafer at an elevated temperature causes dissociation of the molecules of the silicon source gas and the nitrogen source gas into smaller molecules. The smaller molecules then recombine with one another.

In one embodiment. $SiH_4$, $NH_3$, and $N_2$ are introduced with 100 standard cubic centimeters per minute (sccm) of $SiH_4$, 5 standard liters pet minute (slm) of $NH_3$, and 10 slm of $N_2$, while wafer 260 is heated to a temperature of between 600° C. and 800° C. During deposition, pressure in the chamber of between 100 to 500 Torr is maintained. In another embodiment, gases may be used in the following proportions: $SiH_4$:70 sccm, $NH_3$: 2 slm, and $N_2$: 8 slm. In yet another embodiment, gases may be used in the following proportions: dichlorosilane: 230 (sccm) $NH_3$: 1,000 sccm and $H_2$: 9,000 sccm. If $N_2$ is used as a carrier gas, a deposition rate of about 50 to 5,000 Å per minute may be achieved at a temperature as low as 600° C.

By using higher pressure e.g., greater than 100 Torr) in the processing chamber described above, lower temperatures in the chamber may be used. Low temperature deposition is desirable for a number of reasons. For example, lower temperature deposition decreases the risk of outdiffusion of dopants in P or N doped regions of the wafer. Outdiffusion of the P or N doped regions may cause breakdown in be operation of electrical elements such as a transistor, to prevent or reduce outdiffusion of dopants from doped regions that are less than 0.25 μm apart a pressure range of 100–500 Torr is preferable.

Figure 19:
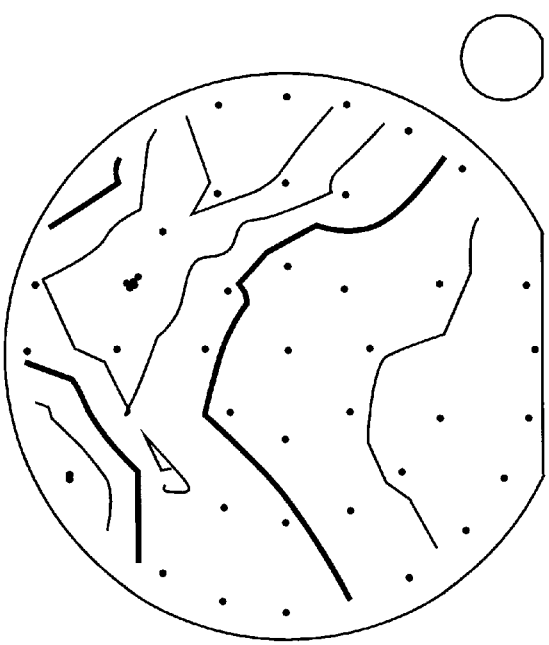
FIG. 19 is a thickness map illustrating a thickness measurement of a film deposited in accordance with an embodiment of a process of the invention.

FIG. 19 is a thickness amp of the thin silicon nitride film deposited on a wafer in accordance with a first example set forth in Table I. Forty-nine points were measured for the thickness map shown in FIG. 18. Using an ellipsometer, the average thickness was 1004.6 Å with a 1% degree of accuracy indicating excellent uniformity of the film and a deposition rate of about 2.000 Å/minute.

TABLE I

| | Deposition Recipe for 1000Å $Si_3N_4$ Film | | |
|---|---|---|---|
| Step number, name | 1, POSITION | 2, GAS ON | 3, HEATUP |
| Chamber Selection | ---D-- ALL CLR | ---D-- ALL CLR | ---D-- ALL CLR |
| Step and control | By Time | By Time | By Time |
| Maximum step time | 5.0 seconds | 5.0 seconds | 10.0 seconds |
| Endpoint selection | No Endpoint | No Endpoint | No Endpoint |
| Pressure | Throttle fully open | Throttle fully open | Servo 275.0 Torr |
| Heater Temperature | Servo 800° | Servo 800° | Servo 800° |
| Heater Spacing | 550 mils | 550 mils | 550 mils |

TABLE I-continued

Deposition Recipe for 1000Å Si₃N₄ Film

| Gas names and flows | | N2: 5000 scc | N2: 9800 scc |
|---|---|---|---|
| BP = Bottom Purge | | N2-BP: 4000 scc | N2-BP: 5000 scc |
| Step number, name | 4, NH3 PRETREATMENT | 5, DEPOSITION | 6, PURGE |
| Chamber Selection | ---D-- ALL CLR | --B---- ALL CLR | ---D-- ALL CLR |
| Step and control | By Time | By Time | By Time |
| Maximum step time | 10.0 seconds | 29.0 seconds | 5.0 seconds |
| Endpoint selection | No Endpoint | No Endpoint | No Endpoint |
| Pressure | Servo 275.0 Torr | Servo 275.0 Torr | Throttle fully open |
| Heater Temperature | Servo 800° | Servo 800° | Servo 800° |
| Heater spacing | 550 mils | 550 mils | 550 mils |
| Gas names and flows | NH3: 3000 scc | NH3: 3000 scc | : |
| | N2: 7000 scc | N2: 7000 scc | N2: 5000 scc |
| | : | SIH4: 50 scc | : |
| | N2-BP: 5000 scc | N2-BP: 5000 scc | : |
| Step number, name | 7, POSITION | | |
| Chamber Selection | ---D-- ALL CLR | | |
| Step and control | By Time | | |
| Maximum step time | 5.0 seconds | | |
| Endpoint selection | No Endpoint | | |
| Pressure | Throttle fully open | | |
| Heater Temperature | Servo 800° | | |
| Heater spacing | 1600 mils | | |
| Gas names and flows | : | | |
| | N2: 5000 scc | | |
| | : | | |

Figure 20:
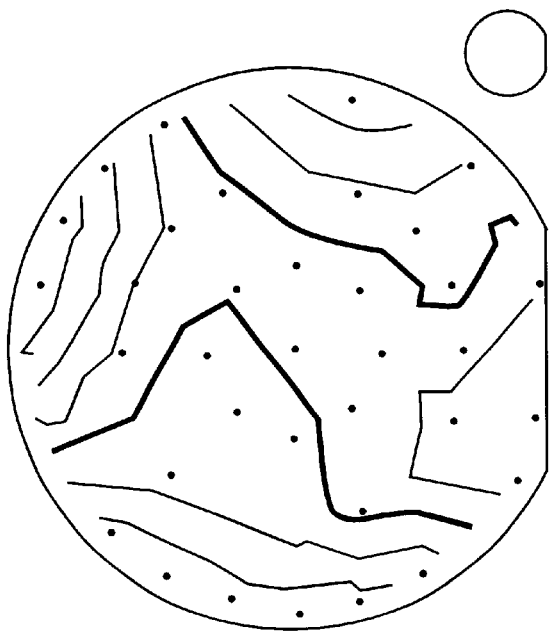
FIG. 20 is a thickness map illustrating a thickness measurement of a film deposited in accordance with an embodiment of a process of the invention.

FIG. 20 is a thickness map of the thin silicon nitride film deposited on the wafer in accordance with a second example set forth in Table II. Again, forty nine points were measured for the thickness map shown in FIG. 20. Using an ellipsometer, the average thickness was 99.72 Å with a 1% degree of accuracy indicating excellent uniformity of the film. The deposition rate was about 300 Å/minute. The measured refractive index of this film indicated that a stoichiometric film was obtained.

TABLE II

Deposition Recipe for 100Å Si₃N₄ Film

| Step number, name | 1, POSITION | 2, GAS ON | 3, HEATUP |
|---|---|---|---|
| Chamber Selection | ---D-- ALL CLR | ---D-- ALL CLR | ---D-- ALL CLR |
| Step and control | By Time | By Time | By Time |
| Maximum step time | 5.0 seconds | 5.0 seconds | 20.0 seconds |
| Endpoint selection | No Endpoint | No Endpoint | No Endpoint |
| Pressure | Throttle fully open | Throttle fully open | Servo 275.0 Torr |
| Heater Temperature | Servo 800° | Servo 800° | Servo 800° |
| Heater spacing | 550 mils | 550 mils | 550 mils |
| Gas names and flows | : | : | : |
| | | N2: 5000 scc | N2: 5000 scc |
| | | : | : |
| BP = Bottom Purge | : | N2-BP: 2000 scc | N2-BP: 2000 scc |
| Step number, name | 4, NH3 PRETREATMENT | 5, DEPOSITION | 6, PURGE |
| Chamber Selection | ---D-- ALL CLR | --B---- ALL CLR | ---D-- ALL CLR |
| Step and control | By Time | By Time | By Time |
| Maximum step time | 10.0 seconds | 19.0 seconds | 5.0 seconds |
| Endpoint selection | No Endpoint | No Endpoint | No Endpoint |
| Pressure | Servo 275.0 Torr | Servo 275.0 Torr | Throttle fully open |
| Heater Temperature | Servo 800° | Servo 800° | Servo 800° |
| Heater spacing | 550 mils | 550 mils | 550 mils |
| Gas names and flows | NH3: 500 scc | NH3: 500 scc | : |
| | N2: 4500 scc | N2: 4500 scc | N2: 5000 scc |
| | : | SIH4: 5 scc | : |
| | N2-BP: 2000 scc | N2-BP: 2000 scc | : |
| Step number, name | 7, POSITION | | |
| Chamber Selection | ---D-- ALL CLR | | |
| Step and control | By Time | | |
| Maximum step time | 5.0 seconds | | |
| Endpoint selection | No Endpoint | | |
| Pressure | Throttle fully open | | |
| Heater Temperature | Servo 800° | | |

TABLE II-continued

Deposition Recipe for 100Å Si$_3$N$_4$ Film

| | |
|---|---|
| Heater spacing | 1600 mils |
| Gas names and flows | : |
| | N2: 5000 scc |
| | : |
| | : |

The thin silicon nitride films of the invention can be deposited, for example over silicon substrates, over silicon oxide, or sandwiched between silicon oxide layers, in accordance with standard semiconductor device processing. No particular pretreatment of the substrate prior to silicon nitride deposition is required, although native silicon oxide may be desired to be removed prior to deposition of the silicon nitride film directly onto silicon, whether single crystal silicon or polycrystalline silicon. This may be accomplished by a standard preclean etch process, either in the same chamber employed for the silicon nitride deposition, or in another chamber of a multi-chamber vacuum processing system.

Processing parameters can be varied to obtain the desired thickness of the silicon nitride films. The temperature during deposition can be varied from about approximately 600 to approximately 800° C. For example, the deposition rate can be increased by increasing the temperature of deposition up to about 800° C., that may be desirable if thicker films, on the order of about 1000 Å in thickness, are to be deposited at practicable rates in a single substrate processing chamber, The pressure can also be varied to affect a change in the deposition rate; in general, the rate of deposition increases as the pressure increases.

The silicon nitride films can be deposited in a stand-alone LPCVD chamber, or, preferably such chamber can be part of a multi-chamber vacuum processing system. In that case the processing chamber of the invention has a port in a sidewall thereof for transferring substrates into and out or the LPCVD chamber from a central transfer chamber.

Figure 21:
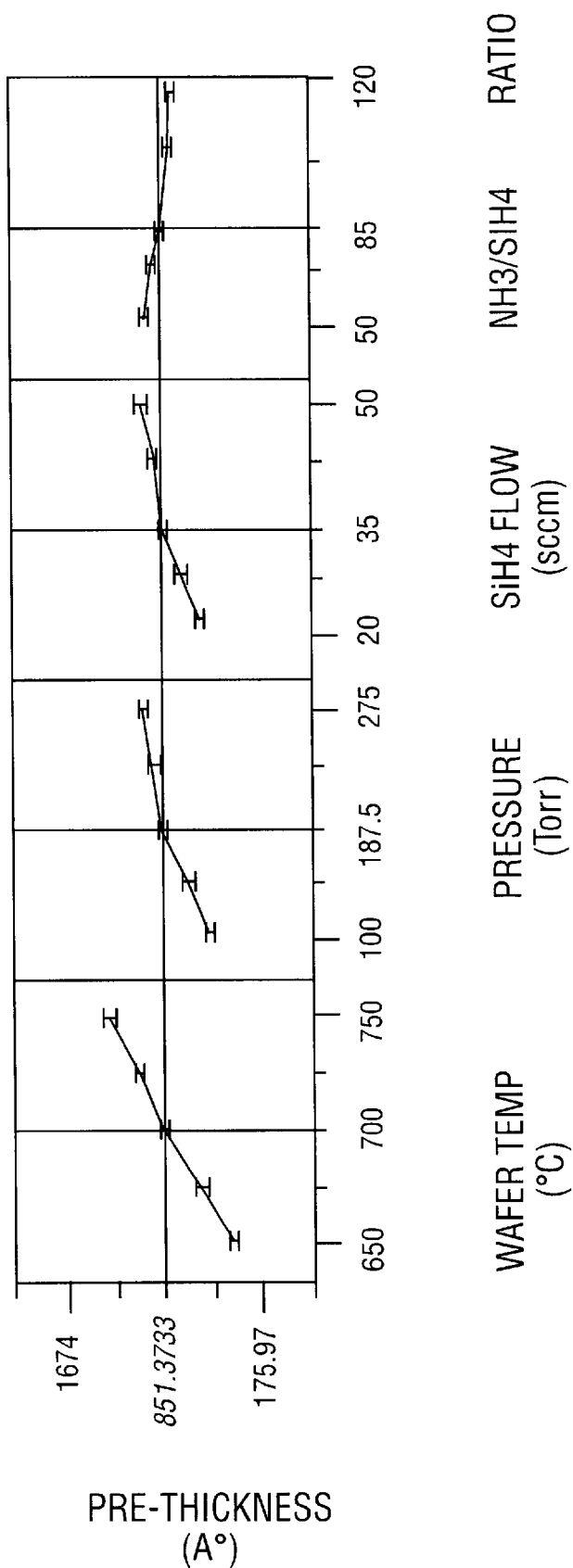
FIG. 21 shows one embodiment of the invention wherein the rate of deposition of silicon nitride on a wafer is shown relative to the pressure in the chamber, the flow rate of silane gas, and the ratio of ammonia gas to silane gas.

FIG. 21 shows one embodiment of the invention wherein the rate of deposition of silicon nitride on a wafer is shown relative to the wafer temperature, the pressure in the chamber, the flow rate of ratio of ammonia gas to silane gas. The pressure in the chamber ranged front approximately 100 Torr to 275 Torr.

Figure 22:
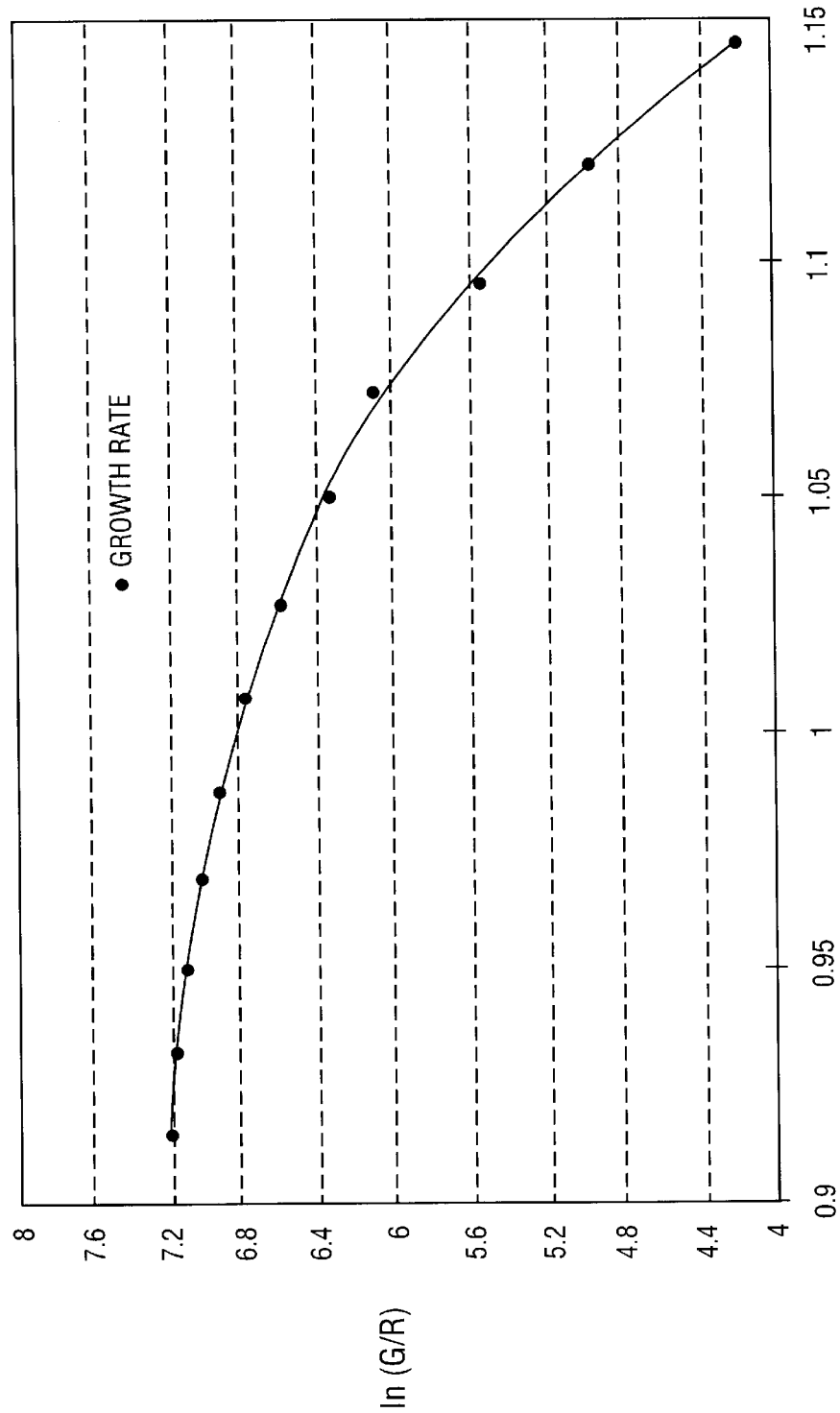
FIG. 22 shows one embodiment of the invention which the deposition rate of silicon nitride is shown relative in temperature wherein the pressure is approximately 100 Torr.

FIG. 22 shows another embodiment of the invention wherein the pressure in the chamber is maintained at approximately 100 Torr. As the temperature increases, the deposition rate of silicon nitride generally increases.

Although the invention has been described with respect to certain types of substrate processing chamber, variations in equipment and design can be made by one skilled in the art and are meant to he included herein. The invention is only to be limited by the scope of the appended claims.

What is claimed:

1. A method of depositing a film of silicon nitride comprising:
   placing a single substrate in a substrate low pressure chemical vapor deposition chamber;
   generating a pressure to from about 100 Torr to about 500 Torr and heating the substrate to a temperature of from about 600° C. to about 800° C.; and
   providing a gas mixture comprising a silicon source gas comprising a silicon hydride and a nitrogen source gas into the chamber.

2. The method of claim 1 wherein the gas mixture further includes a carrier gas.

3. The method of claim 2 wherein the carrier gas is selected from the group consisting of hydrogen, nitrogen, argon, and helium.

4. The method of claim 1 wherein the gas mixture comprises about 230 sccm of dichlorosilane, about 1000 sccm of ammonia and about 9000 sccm of hydrogen.

5. The method of claim 1 wherein a rate of deposition ranges from approximately 40 Å per minute to about 5,000 Å per minute.

6. The method of claim 1, wherein nitrogen source gas is ammonia.

7. The method of claim 1, wherein the partial pressure of the silicon source gas is approximately in the range of 0.05 to 5 Torr.

8. The method of claim 1, wherein ammonia has a partial pressure equal to or less than 300 Torr.

9. A method of forming a silicon nitride layer on a semiconductor wafer, comprising the steps of:
   locating a semiconductor wafer on a susceptor within a processing chamber;
   mixing at least three gases comprising
      a carrier gas selected from the group consisting of H$_2$, N$_2$, He, and Ar,
      a nitrogen source gas, and
      a silicon source gas comprising a silicon hydride;
   introducing the mixture of gases into the semiconductor processing chamber;
   exposing the wafer to the mixture; and
   maintaining a pressure in the semiconductor processing chamber in the range of 100 to 500 Torr.

10. The method of claim 9 wherein the flow rate of at least one of the gases is 5 liters per minute to 15 liters per minute for a semiconductor processing chamber having a volume in the range of 1 to 9 liters.

11. The method of claim 9 wherein the ratio of a flow rate of at least one gas to the volume of a semiconductor processing chamber is 0.7 to 5.

12. The method of claim 9 wherein at least two of the bases are at least partially mixed within the semiconductor processing chamber.

13. The method of claim 9 wherein the nitrogen source gas is NH$_3$.

14. The method of claim 9 further comprising heating the wafer to a temperature of between 600° C. and 800° C. prior to exposing the wafer to the mixture of gases.

15. A method of forming a silicon nitride layer on a semiconductor wafer, comprising the steps of:
   locating the semiconductor wafer on a susceptor within a semiconductor processing chamber;
   mixing at least three gases in the semiconductor processing chamber, the at least three gasses comprising
      a carrier gas,
      a NH$_3$ source gas, and a silicon source gas selected from the group consisting of silane ($SiH_4$), dichlorosilane ($SiH_2Cl_2$), and disilane ($Si_2H_6$);

exposing the semiconductor wafer to the mixture of gases; and maintaining a pressure in the semiconductor processing chamber in the range of 100 to 500 Torr.

16. The method of claim 15 wherein the flow rate of at least one of the gases is in the range of 1 slm to 12 slm.

17. The method of claim 15 further comprising heating the wafer to a temperature of between 600° C. and 800° C. prior to exposing the wafer to the mixture of gases.

18. The method of claim 15 wherein the nitride layer forms at a rate in the range of between 40 Å per minute and 5,000 Å per minute.

19. The method of claim 15 wherein the carrier gas is selected from the carrier gas selected from the group consisting of $H_2$, $N_2$, He, and Ar.

20. A method of depositing a film of silicon nitride comprising:

placing a single substrate in a substrate low pressure chemical vapor deposition chamber;

generating a pressure from about 100 Torr to about 500 Torr and heating the substrate to a temperature of about 600° C. to about 800° C.; and providing a gas mixture comprising a silicon source gas and a nitrogen source gas into the chamber; and the silicon source gas is selected from the group consisting of silane ($SiH_4$) and disilane ($Si_2H_6$).

21. A method of depositing films of silicon nitride onto a substrate in a chemical vapor deposition chamber, comprising:

(a) supporting a single substrate in the chamber;

(b) adjusting the pressure in the chamber form about 100 Torr to about 500 Torr and heating the substrate to a temperature from about 600° C. to 800° C.; and (c) passing a silicon source gas comprising a silicon hydride into the chamber.

22. The method of claim 21 wherein the nitride layer forms at a rate in the range of between 40 Å per minute and 5,000 Å per minute.

23. The method of claim 21 further comprising:

removing a gas from the chamber through a pumping plate, the pumping plate has a first stepped portion, a second stepped portion, and a third stepped portion, wherein the third stepped portion has a plurality of holes circumferentially spaced.

24. The method of claim 1, wherein the silicon hydride is selected from the group consisting of silane ($SiH_4$), dichlorosilane ($SiH_2Cl_2$), and disilane ($SiH_6$).

25. The method of claim 9, wherein the silicon hydride is selected from the group consisting of silane ($SiH_4$), dichlorosilane ($SiH_2Cl_2$), and disilane ($SiH_6$).

26. The method of claim 21, wherein the silicon hydride is selected from the group consisting of silane ($SiH_4$), dichlorosilane ($SiH_2Cl_2$), and disilane ($SiH_6$).

* * * * *